(12) United States Patent
Mori et al.

(10) Patent No.: US 7,078,610 B2
(45) Date of Patent: Jul. 18, 2006

(54) ELECTRONIC PERCUSSION INSTRUMENT

(75) Inventors: Chiharu Mori, Hamamatsu (JP); Kazuaki Inoue, Inasu-gun (JP)

(73) Assignee: Roland Corporation, Osaka (JP)

( * ) Notice: Subject to any disclaimer, the term of this patent is extended or adjusted under 35 U.S.C. 154(b) by 80 days.

(21) Appl. No.: 10/817,771

(22) Filed: Apr. 2, 2004

(65) Prior Publication Data

US 2004/0255764 A1    Dec. 23, 2004

(30) Foreign Application Priority Data

| Apr. 4, 2003 | (JP) | ............................. 2003-101127 |
| Apr. 14, 2003 | (JP) | ............................. 2003-109533 |
| Apr. 16, 2003 | (JP) | ............................. 2003-111149 |

(51) Int. Cl.
*G10H 1/06* (2006.01)
(52) U.S. Cl. .................. 84/735; 84/604; 84/612; 84/615; 84/742
(58) Field of Classification Search ................ 84/742, 84/604, 735, 615, 612
See application file for complete search history.

(56) References Cited

U.S. PATENT DOCUMENTS

| 4,932,303 | A | * | 6/1990 | Kimpara | ..................... 84/621 |
| 5,247,128 | A | * | 9/1993 | Suzuki | ..................... 84/611 |
| 5,281,756 | A | * | 1/1994 | Kawashima | ................. 84/615 |
| 5,399,801 | A | * | 3/1995 | Hasebe et al. | ............... 84/622 |
| 6,525,254 | B1 | * | 2/2003 | Tsutsumi | ..................... 84/615 |
| 6,754,351 | B1 | * | 6/2004 | Tanji | ......................... 381/61 |
| 2004/0025663 | A1 | * | 2/2004 | Harada et al. | ............... 84/104 |

* cited by examiner

*Primary Examiner*—Jeffrey W Donels
(74) *Attorney, Agent, or Firm*—Foley & Lardner LLP

(57) ABSTRACT

An electronic percussion instrument samples an input waveform. An unused waveform number may be automatically assigned to the sampled waveform upon sampling or when a user-specified waveform number is already in use for another waveform. Musical time parameters for the input waveform may be specified in advance of sampling, and an endpoint for the sampled waveform may be automatically set in response to a stop sampling command so that length of the waveform is a whole number of musical time units such as bars or beats. The endpoint of the sampled waveform may be set to the beginning or the end of the musical time unit during which the stop command is received, depending on the time at which the stop command is received. The sampled waveform may be edited by manually moving the starting point by a specified amount and automatically moving the end point by a corresponding amount, by changing the specified tempo of the waveform, or by specifying a different number of musical time units.

29 Claims, 14 Drawing Sheets

| Waveform Number | Waveform Parameters |
|---|---|
| 001 | SA/EA/T/B/SP/EP |
| 002 | SA/EA/T/B/SP/EP |
| 003 | SA/EA/T/B/SP/EP |
| 004 | SA/EA/T/B/SP/EP |
| ⋮ | ⋮ |
| 063 | SA/EA/T/B/SP/EP |
| 064 | 00 |
| 065 | SA/EA/T/B/SP/EP |
| 066 | 00 |
| 067 | 00 |
| ⋮ | ⋮ |
| 128 | 00 |

FIG. 3

| Patch Number | Pad Number | | | | |
|---|---|---|---|---|---|
| | 1 | 2 | 3 | ... | 9 |
| 001 | 020 | 024 | 032 | ... | 028 |
| 002 | 024 | 022 | 021 | ... | 024 |
| ... | ... | ... | ... | ... | ... |
| 128 | 040 | 041 | 024 | ... | 049 |

FIG. 5

| Patch Number | Pad Number | | | | |
|---|---|---|---|---|---|
| | 1 | 2 | 3 | ... | 9 |
| 001 | 1 | 0 | 0 | ... | 0 |

FIG. 6A

| Patch Number | Pad Number | | | | |
|---|---|---|---|---|---|
| | 1 | 2 | 3 | ... | 9 |
| 001 | 0 | 1 | 0 | ... | 0 |
| 002 | 1 | 0 | 0 | ... | 1 |
| 128 | 0 | 0 | 1 | ... | 0 |

FIG. 6B

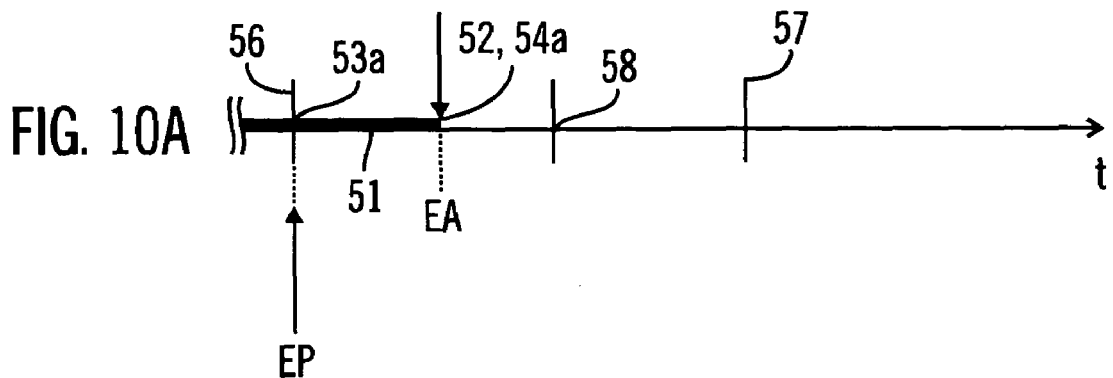
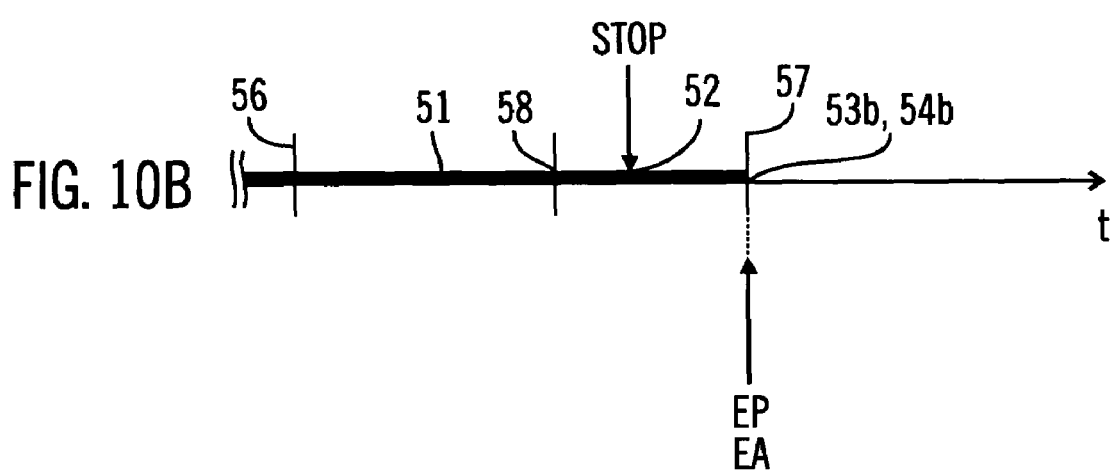
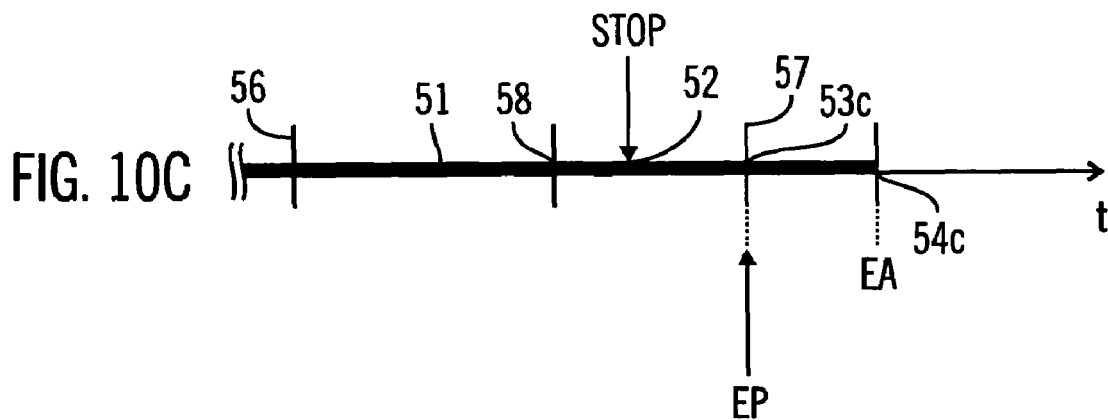

ELECTRONIC PERCUSSION INSTRUMENT

BACKGROUND OF THE INVENTION

1. Field of the Invention

Embodiments of the present invention relate to electronic percussion instruments.

2. Related Technology

Conventional electronic musical instruments provide sampling of waveforms. Typically a waveform number is associated with a sample waveform to identify the sampled waveform.

Japanese Unexamined Patent Application Publication (Kokai) Number Hei 08-76763 teaches an electronic musical instrument in which an external waveform is sampled, the sampling data are stored in a waveform memory, and the sampled waveform can be auditioned. To store sampled data, the user selects a waveform number for the sampled waveform before the sampling data can be written to the waveform memory, and the waveform data is stored in association with that waveform number. To audition a sampled waveform, the user operates an audition key that corresponds to the waveform number of the sampled waveform, and the waveform data that corresponds to the audition key are read out. However, to store sampled data, the user must first determine an unused waveform number that can be used for the new sampled data. Further, to audition a sampled waveform, the user must first set up an audition key so that it will reproduce the waveform having a given waveform number.

Japanese Unexamined Patent Application Publication (Kokai) Number Sho 58-118699 teaches an electronic percussion instrument in which waveform data that have been assigned to respective pads are reproduced upon striking of the pads. In this instrument, sets of waveform data are associated in a group referred to as a patch, and to reduce memory requirements, the patch stores the waveform numbers of the individual waveforms rather than the sampled waveform data. However, in this device, in order to determine the patch and pad to which a waveform is assigned, it is necessary to strike every pad in order to hear the waveforms, or to sequentially read information about each of the patches from a display. Thus it can be difficult to locate a particular waveform among many patches.

Japanese Unexamined Patent Application Publication (Kokai) Number Hei 11-133968 teaches an electronic musical instrument in which sample waveform data can be stored in a waveform memory. The device is configured such that when a "recording stop" button is operated by the operator during the sampling of the waveform data, recording continues for a fixed amount of time referred to as a stop delay time, after which recording is stopped. However, the stop point becomes the end address of the waveform data, and since the stop delay time is arbitrary with respect to the musical time of the sampled waveform, it is difficult to stop the recording process such that the end address of the sampled waveform occurs at a musically appropriate position. Consequently, the user must typically edit the sampled waveform data after sampling to cut the waveform data at a position that is musically appropriate for the waveform. This is particularly complex when the waveform has a rhythm that comprises a complicated beat or a plurality of bars.

SUMMARY OF THE INVENTION

Embodiments of the invention are directed to electronic percussion instruments that provide a variety of features as described herein.

In accordance with one embodiment, an electronic percussion instrument samples an input waveform and an identifier is assigned to the sampled waveform. An unused waveform number may be automatically assigned to the sampled waveform upon sampling. Alternatively, a user may specify a desired waveform number, and if the user-specified waveform number is already in use for another waveform, an unused waveform number is automatically assigned.

In accordance with further embodiments, musical time parameters for the input waveform may be specified in advance of sampling. Various time parameters such as the tempo of the input waveform and the beat count of a bar of the input waveform may be specified. The time parameters may be used to automatically set an endpoint for the sampled waveform such that the length of the sampled waveform is a whole number of musical time units such as bars or beats. The endpoint of the sampled waveform may be set to the beginning or the end of the musical time unit during which the stop command is received, depending on the time at which the stop command is received. For example, the endpoint of the sampled waveform may be set to the end of the musical time unit during which the stop command is received when the stop command is received after the intermediate point of the musical time unit.

In accordance with further embodiments, the sampled waveform may be edited by the user. The user may manually move the starting point of the sampled waveform by a specified amount, and the end point of the sampled waveform is automatically moved by a corresponding amount to preserve the length of the sampled waveform in units of musical time. The user may also edit the sampled waveform by changing the tempo that is specified for the waveform, causing the endpoint of the sampled waveform to be relocated to maintain the same number of musical time units in view of the new tempo. The user may also edit the sampled waveform by specifying a different number of musical time units for the sampled waveform, causing the endpoint of the sampled waveform to be moved to an appropriate new location.

BRIEF DESCRIPTION OF THE DRAWINGS

FIG. 3 is a drawing that shows a waveform list that is provided in a waveform memory;

FIG. 5 is a table showing the waveform numbers that are assigned to the respective pads of each patch;

FIG. 6(a) and FIG. 6(b) are schematic drawings that show tables indicating the patch numbers and pad numbers for a specified waveform number;

FIG. 10(a), FIG. 10(b) and FIG. 10(c) show timing relationships among the time at which a stop switch has been pressed during sampling of the waveform data, the end point (EP) that is set by the specified processing, and the recording stop position (EA); FIG. 10(a) shows the case where the timing of the stop SW pressing is at or before the intermediate point of the sampled bar; FIG. 10(b) and FIG. 10(c) show alternatives for the case where the timing of the stop SW pressing is later than the intermediate point of the sampled bar;

DETAILED DESCRIPTION OF THE INVENTION

Figure 1:
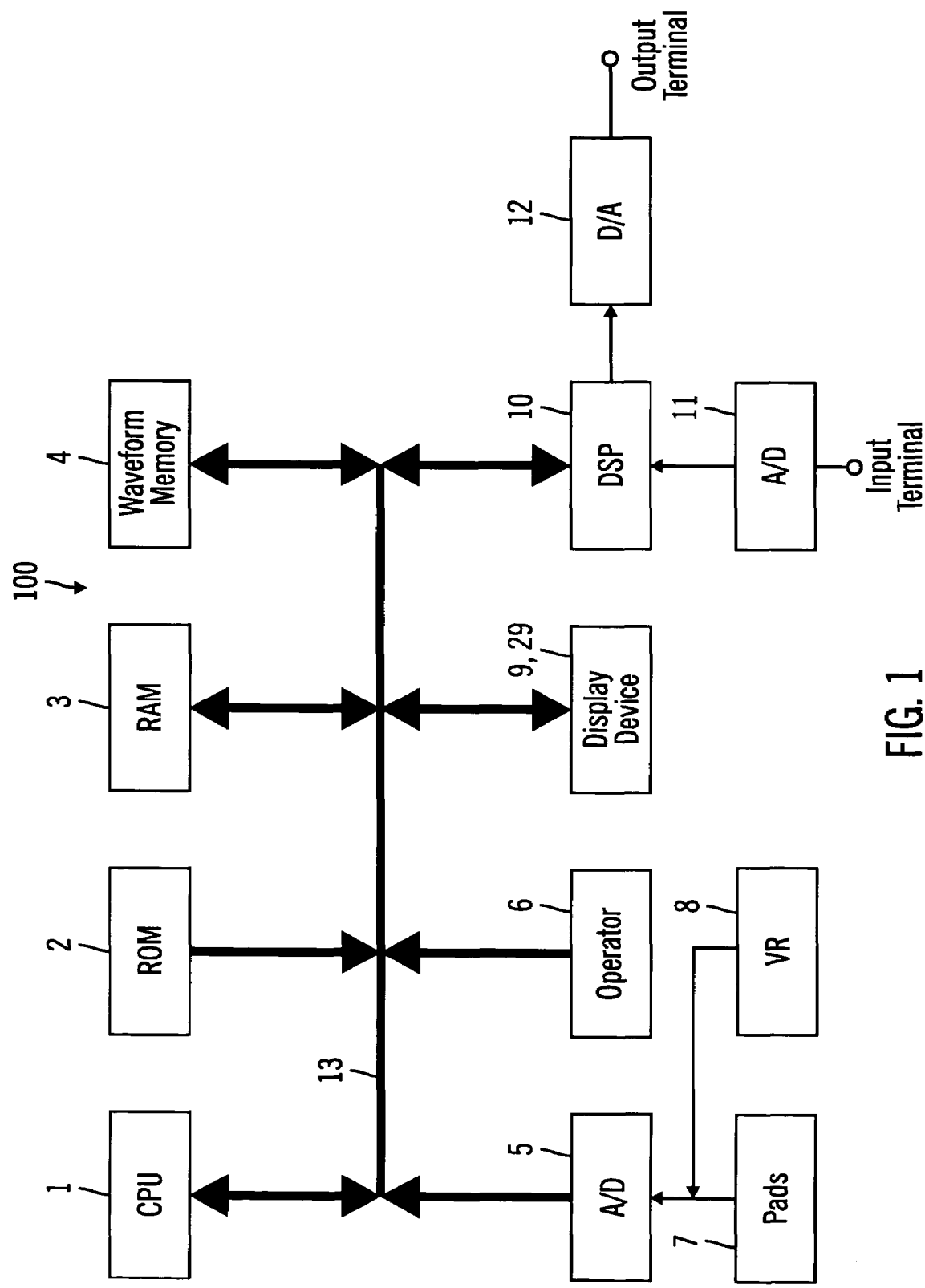
FIG. 1 is a block drawing that shows components of an electronic percussion instrument in accordance with a preferred embodiment of the invention.

An explanation will be given regarding a preferred embodiment of the present invention while referring to the attached drawings. FIG. 1 is a block drawing that shows components of the electrical configuration of the electronic percussion instrument 100 in a preferred embodiment of the present invention.

The electronic percussion instrument 100 includes a CPU 1, ROM 2, RAM 3, waveform memory 4, analog to digital converter (A/D) 5, which converts the analog signals that are input from the pads 7 and VR (variable resistor) 8 into digital signals, operators 6, display devices 9 and 29, DSP 10, bus line 13 that interconnects these components, analog to digital converter (A/D) 11, which converts the analog signal that is input from the input terminal into a digital signal for processing by the DSP 10, and digital to analog converter (D/A) 12, which converts the digital signal that is input from the DSP 10 to an analog signal for reproduction as a musical tone through a speaker or the like (not shown in the drawing) that has been connected to an output terminal.

The CPU 1 is the central processing unit that controls the entire electronic percussion instrument 100, the ROM 2 is a read only memory that stores the various kinds of control programs that are executed by the CPU 1 and the fixed value data tables and the like that are referenced at the time of execution. The RAM 3 is a random access memory that has the working area in which various types of register groups that are required for the control programs that are executed by the CPU 1 are set and the temporary area in which data that are being processed are temporarily stored, and the like.

The waveform memory 4 is a nonvolatile memory such as a flash memory and the like with which writing is possible and the like in which a plurality of waveform data, the waveform numbers and the various kinds of parameters that are related to each of the waveform data, and a plurality of patches (timbre information that includes assignments of waveform data to the nine pads 7a through 7i) are stored. In the waveform memory 4, preset waveform data (musical tone data) are stored and, together with this, waveform data that have been sampled by the user are stored. For each set of waveform data that are stored in the waveform memory 4, the corresponding analog waveform data have codes appended for the amplitude value of the time sequence (for each of the sampling periods) and the amplitude values for which coding has been done in each sampling period are each stored in the storage position that is designated by the storage address and the like. Incidentally, removable memory such as a Compact Flash (™) and the like may be used as the waveform memory 4.

The operators 6 are an operator group with which the setting of the parameters and the mode settings are carried out. In this first preferred embodiment, the operators 6 include the effect selection button 19, the start/stop switch 20, the decrease (DEC) button 21, the increase (INC) button 22, the patch selection button 23, the wave selection button 24, the mode selection button 25, the page left (L) button 26, the page right (R) button 27, the information instruction button 28, the exit button 30, the enter button 31, and the like.

Figure 2:
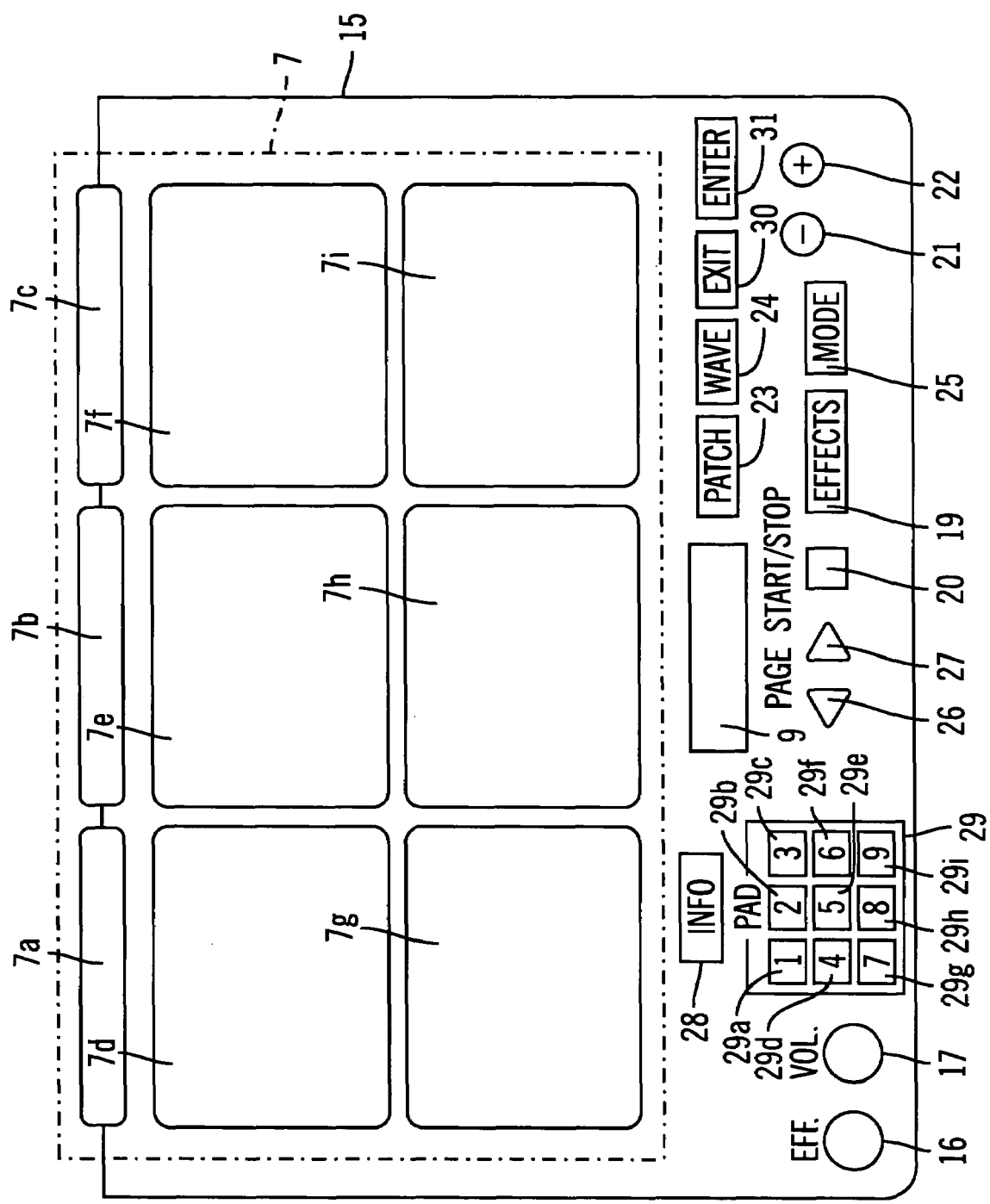
FIG. 2 is a front elevation of the operating panel of the electronic percussion instrument in accordance with a preferred embodiment of the invention.

The pads 7 comprise the nine pads 7a through 7i (refer to FIG. 2). Striking sensors such as piezo elements are furnished on the rear surfaces of each of the pads 7a through 7i. The vibrations that are produced by the striking of a pad 7 are captured by the striking sensors and output to the A/D 5 as an analog electrical signal. The analog electrical signal that has been input to the A/D 5 is converted into a digital signal and that digital signal is detected by the CPU 1. A velocity value is set based on the digital signal that has been detected. This corresponds to the striking intensity for each of the pads 7a through 7i and is used to modify the parameters of the effect that is applied.

The VR 8 is a variable resistor such as the knob 16 for effect control, the knob 17 for volume adjustment, or an adjusting pedal (not shown in the drawing) that can be adjusted within a specified range and the like. The analog voltage value that has been output from the VR 8 is input to the A/D 5 and converted into a digital value and that digital value is detected by the CPU The DSP 10 is a digital signal processor for processing the waveform data (the musical tone data) of the digital signal. The DSP 10 stores the waveform data that have been sampled and digitized by the A/D 11 in the waveform memory 4 and, together with this, applies a specified effect to the digital waveform data that have been read out from the waveform memory 4 and outputs this to the D/A 12. Specifically, the sampling processing (FIG. 11), which will be discussed later, is executed for a specified sampling period (for example, 44.1 kHz) and the converted waveform data are stored in the waveform memory 4. In addition, the waveform data that are stored in the waveform memory 4 are read out, output to the D/A 12 and reproduced.

FIG. 2 is a front elevation drawing of the operating panel 15 of the electronic percussion instrument 100. The operating panel 15 is provided with the pads 7 that comprise the nine pads (the striking surfaces) 7a through 7i, the LCD 9 as a display device, the pad indicator 29 as a display device which is furnished with the nine LEDs 29a through 29i that correspond respectively to the nine pads 7a through 7i, the effect adjustment knob 16 for the control of the parameters of the effects that are set, the volume control knob 17 for adjusting the output musical tone level, the effect selection button 19, the start/stop switch 20, the DEC button 21, the INC button 22, the patch selection button 23, the wave selection button 24, the mode selection button 25, the page L button 26, the page R button 27, the information instruction button 28, the exit button 30, and the enter button 31.

The effect selection button 19 is a button for the selection of one parameter from among the parameters of the various kinds of effects that are applied to the waveform data.

The start/stop switch (the start SW or the stop SW) 20 is a button for the instruction to start and stop one operation in each of the various operating modes of the electronic percussion instrument 100 (for example, the starting and stopping of recording). Incidentally, the start/stop SW 20 functions alternately as a start SW or a stop SW with each operation (pressing).

Figure 4:
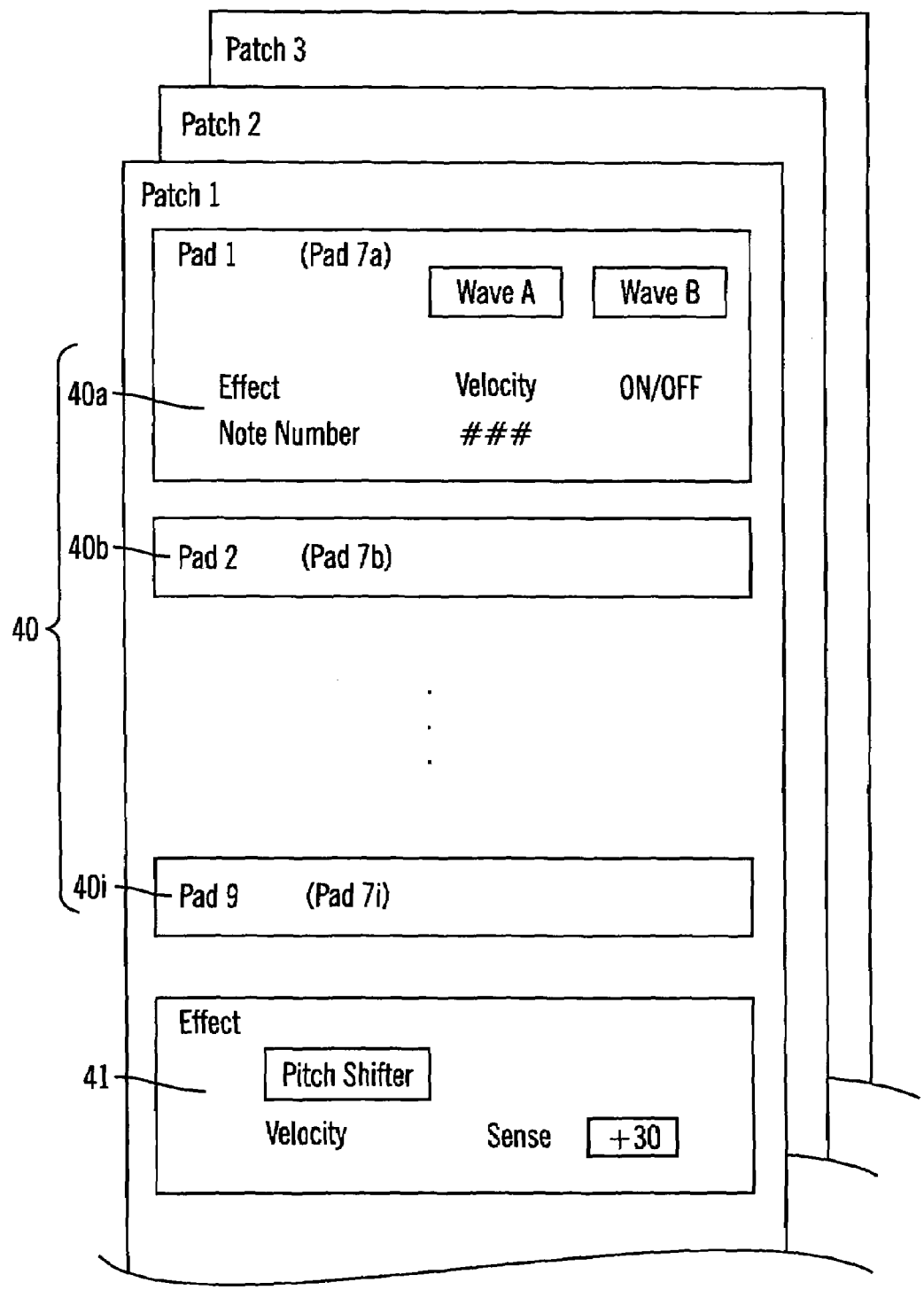
FIG. 4 shows a configuration of a patch that contains settings for each of the pads and an effect that is applied in common to the pads.
Figure 7A:
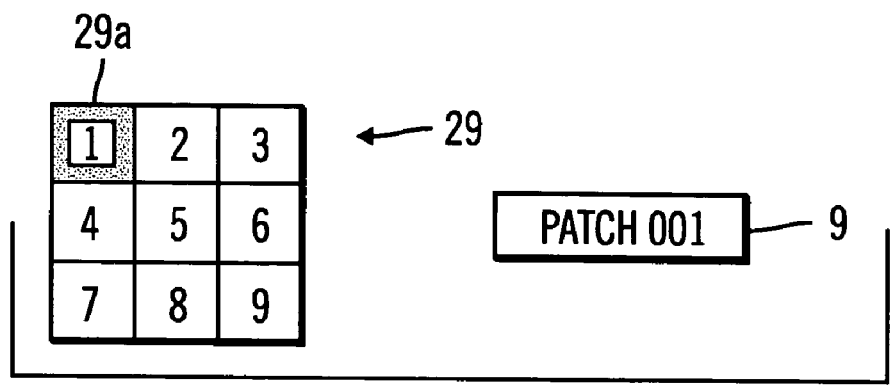
FIG. 7(a), FIG. 7(b), FIG. 7(c) and FIG. 7(d) show display states of a pad indicator and an LCD.
Figure 7B:
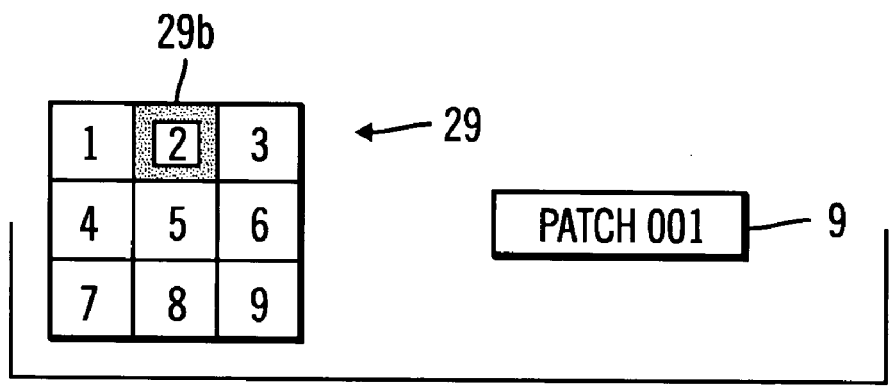
Figure 7C:
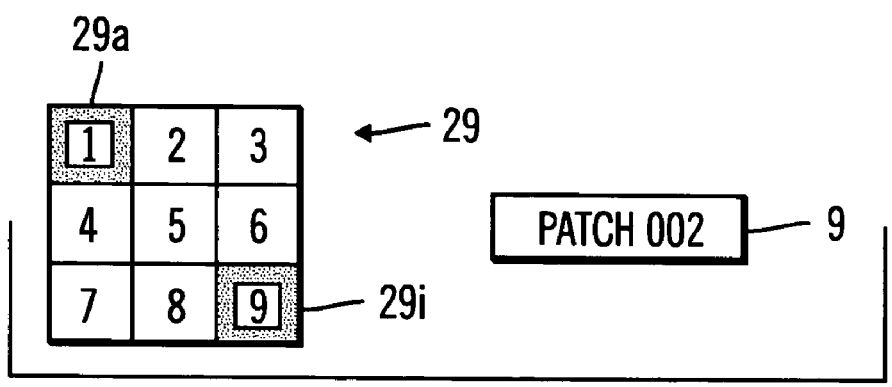
Figure 7D:
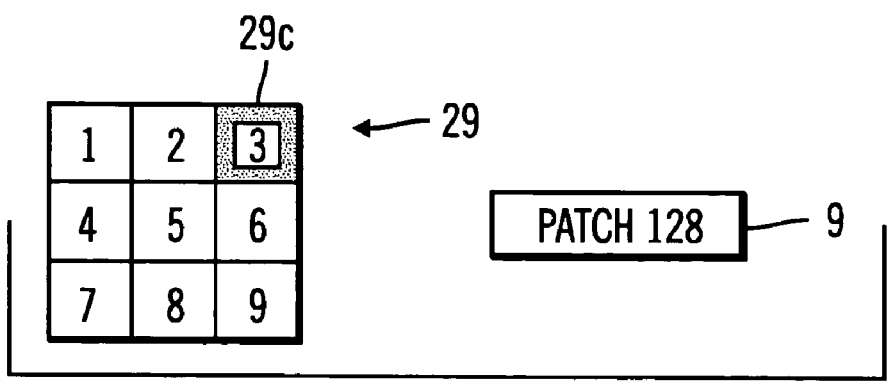

The patch selection button 23 is a button for launching the patch mode for selecting processing by a patch (timbre information) unit, and for selecting one patch from among various patches that are stored in the waveform memory 4 (refer to FIG. 4). In addition, when the patch selection button 23 is pressed in the recording mode, the recording is executed in the patch mode.

The wave selection button 24 is a button for launching the wave mode for processing by each waveform data unit and for the selection, in the wave mode, of one set of waveform data (or one waveform number) from the various kinds of waveform data that are stored in the waveform memory 4. In addition, when the wave selection button 24 is pressed in the recording mode, the recording is executed in the wave mode.

The mode selection button 25 is a button for carrying out the selection of the operating mode of the electronic percussion instrument 100. Incidentally, as the operating modes of the electronic percussion instrument 100 of this preferred embodiment there are those such as a performance mode for carrying out the performance, a setting mode for setting the various parameters, a recording mode for recording (sampling) sound (waveform data) input from outside, an editing mode with which editing of the waveform data is carried out, and the like.

The information instruction button 28 is a button for instructing the start of the retrieval of the use state of any of the waveform data.

The exit button 30 is a button that is operated in order to exit from the processing that is being executed and, for example, in this preferred embodiment, is operated in the recording processing (FIG. 9), which will be discussed later, in those cases where waveform data that have been recorded do not exist. In addition, the enter button 31 is a button that is operated in order to ascertain the processing that is being executed and, for example, is this preferred embodiment, is operated in those cases where, in the recording processing (FIG. 9), which will be discussed later, waveform data that have been recorded exist.

The LCD 9 is a unit for the display of the operating status of the electronic percussion instrument 100 (such as information on each of the various operating modes, each of the various parameter values, and the like). Specifically, screens are displayed in conformance with, for example, the parameters of the effect that has been selected by the effect selection button 19, the patch that has been selected by the patch selection button 23, the waveform data that have been selected by the wave selection button 24, the operating mode information that has been selected by the mode selection button 25, the information that is related to the usage state of the waveform data that have been retrieved by means of the information instruction button 28, and the like. With the operating status displayed on the display screen of the LCD 9, when the page L button 26 or the page R button 27 is operated, the display screen can be toggled, and the parameter selection, patch selection, wave selection, and the like can be done. In addition, each of the numbers and values can be modified and input by the operation and increase or decrease of the DEC button 21 or the INC button 22.

FIG. 3 is a drawing that shows schematically the waveform list 30 that is stored in the memory 4. The waveform list 30 is a data table that stores the waveform numbers of sampled waveforms that are stored in the waveform memory 4 and the parameters of those waveforms. In the preferred embodiment the table is configured to store up to 128 waveform numbers and associated.

For the waveform data that are stored in the waveform memory 4, the start address (SA) of the waveform data, the end address (EA) of the waveform data, the performance tempo (T) of the waveform data, the beat count (B) of the waveform data, the start point (SP), which is the readout start address of the waveform data, and the end point (EP), which is the readout end address of the waveform data, are stored in the waveform list 30 as the waveform parameters that correspond to the waveform numbers of each of the waveform data sets. On the other hand, with regard to waveform numbers for which waveform data do not exist in the waveform memory, "0" data are stored as the waveform parameters.

Incidentally, in the waveform list 30 that is shown in FIG. 3, the waveform parameters related to the waveform data of waveform numbers 001 through 063 and 065 that are stored in the waveform memory are stored but, on the other hand, for the waveform numbers 064 and 066 through 128, for which waveform data do not exist, "0" data are stored. In other words, the waveform numbers 001 through 063 and 065 are numbers that have already been used as waveform numbers and waveform numbers 064 and 066 through 128 are numbers that have not been used as waveform numbers.

Next, an explanation will be given regarding the configuration of the patch while referring to FIG. 4. FIG. 4 is a drawing for the explanation of the configuration of patches the specify the waveforms associated with which of the pads 7*a* through 7*i* and any effect that is applied in common to those waveforms.

The patch is stored in the waveform memory 4 and, in this preferred embodiment, the patches 1 through 3 are shown in the drawing. Incidentally, it is preferred that any number of patches can be created. By defining waveforms for pads 7*a* through 7*i* and the effects that are applied in common to those waveforms in a plurality of patches, it is possible to provide a performance that conforms to the preferences of the performer even when there are configurations for nine pads.

An explanation will be given here regarding the configuration of the patch 1 as one example. In the patch 1 are the regions 40 (40*a* through 40*i*) that define the various kinds of conditions for the pads 1 through 9 that correspond to the pads 7*a* through 7*i*, and the region 41 that sets the effect for the application of the effect in conformance with the striking intensity. In this preferred embodiment, the same effect is applied to all waveforms in the patch.

With the pad 1 (the region 40*a*), the setting of the wave that is assigned to the pad 1, the on/off for the velocity, and the note number can be set. In this preferred embodiment, both the "wave A" and the "wave B" are assigned as the wave. The "wave A" and "wave B" are stored respectively as the "waveform data A" and the "waveform data B" in the waveform memory 4. Incidentally, these sets of waveform data are each stored with different waveform numbers appended so that they each can be distinguished from each other.

The on/off setting for velocity indicates whether the parameters of the effect that is to the waveforms of the patch are modified for this waveform in accordance with the velocity value of strikes applied to this pad. In those cases where it is "on," the parameters of the effect are modified and the effect is applied to the musical tone by the DSP 10 based on the modified parameters. In those cases where the velocity is "off," the parameters of the effect are not modified by the velocity.

With regard to the note number, when the striking of the pad is detected, a MIDI standard note-on signal is output and the note number of the note-on signal is set by this. The velocity that corresponds to the striking intensity is output as the velocity value of the note-on signal.

Incidentally, for the pad 2 through the pad 9 also, the wave, velocity on/off, and the note number are respectively set in the same manner as for the pad 1.

An effect area of the patch (region 41) contains data indicating a type of effect, effect parameter values, and whether an operator or strike velocity modifies the parameters of the effect. In this preferred embodiment, the pitch shifter is selected as the type of effect. For the pitch shifter, musical tones that are input with publicly known effects are stored sequentially in memory and the pitch is changed by changing the writing speed and the readout speed. It is possible to set various kinds of parameters. With regard to the types of effects, in addition to the pitch shifter, there are those such as the flanger that controls the delay of the waveform data and filters that exclude specified frequency bands (not shown in the drawing) and the setting of various kinds of effects is possible.

FIG. 5 is a table that shows schematically the state of the waveform numbers that are assigned respectively to the pads of each patch. Incidentally, the figures in the table express only the waveform numbers that have been applied for the wave A for each pad. The waveform number for a waveform is assigned in the recording process described below with respect to FIG. 9. Each waveform is associated with a unique waveform number.

The table that is shown in FIG. 5 is configured with the rows as the patch numbers (001 through 128) and the columns as the pad numbers (1 through 9). In accordance with FIG. 5, it can be seen that "020" is assigned as the waveform number of the wave A to the pad 1 of the patch 1 and "024" is assigned as the waveform number of the wave A to the pad 2. Therefore, under the condition in which the patch 1 is selected, when the pad 1 is struck, the waveform data A of the waveform number "020" are read out from the waveform memory 4 as the wave A and a musical tone is generated by the DSP 10 from the waveform data A. In the explanation that will be given hereinafter, the table that is shown in FIG. 5 will be referred to as "FIG. 5."

FIG. 6 is a table that shows schematically the results of the retrieval of the patch numbers and the pad numbers that correspond to any of waveform numbers that have been selected. In other words, the table shows which pads of which patches have a given waveform assigned thereto. For example, FIG. 6(*a*) shows the results for the waveform number "020" and FIG. 6(*b*) shows the results for the waveform number "024." In FIG. 6(*a*) and FIG. 6(*b*) the tables are configured with the rows as the patch numbers and the columns as the pad numbers (the numbers 1 through 9), with "1" indicating a pad to which the waveform is assigned, and "0" indicating a pad to which the waveform is not assigned, as may be seen by comparison of FIGS. 6(*a*) and 6(*b*) to the table of FIG. 5. As further seen in FIGS. 6(*a*) and 6(*b*), patches that do not contain the waveform are not displayed.

FIGS. 7(*a*)–7(*d*) are phase drawings that show examples of the display condition of the pad indicator 29 and the LCD 9 of FIG. 2. FIG. 7(*a*) is the display that corresponds to the patch of FIG. 6(*a*), and FIG. 7(*b*) through 7(*d*) are displays that correspond to the patches of FIG. 6(*b*).

The display of FIG. 7(*a*) corresponds to the patch information of FIG. 6(*a*) which was retrieved in response to a query regarding waveform number 020. The LCD 9 indicates that the displayed information is for patch 001, and the LEDs 29 are illuminated so as to indicate that pad 1 is associated with waveform 020 in patch 001.

FIGS. 7(*b*) through 7(*d*) show similar displays for the patch information of FIG. 6(*b*). In each case the patch number is displayed and the LEDs are illuminated to indicate the pads that correspond to the waveform 024. As is shown in FIG. 7(*b*), "Patch 001" is displayed on the screen of the LCD 9, and the LED 29*b* is lit on the pad indicator 29. As shown in FIG. 7(*c*), "Patch 002" is displayed on the LCD 9, and the LED 29*a* and the LED 29*i* are lit. As shown in FIG. 7(*d*), "Patch "128" is displayed on the screen of the LCD 9, and the LED 29*c* is lit. The page R button 27 and the page L button 26 can be used to browse through displays for multiple patches using the same waveform.

The processing performed by the device in regard to waveform sampling and waveform management is now discussed with reference to FIG. 8 through FIG. 15.

Figure 8:
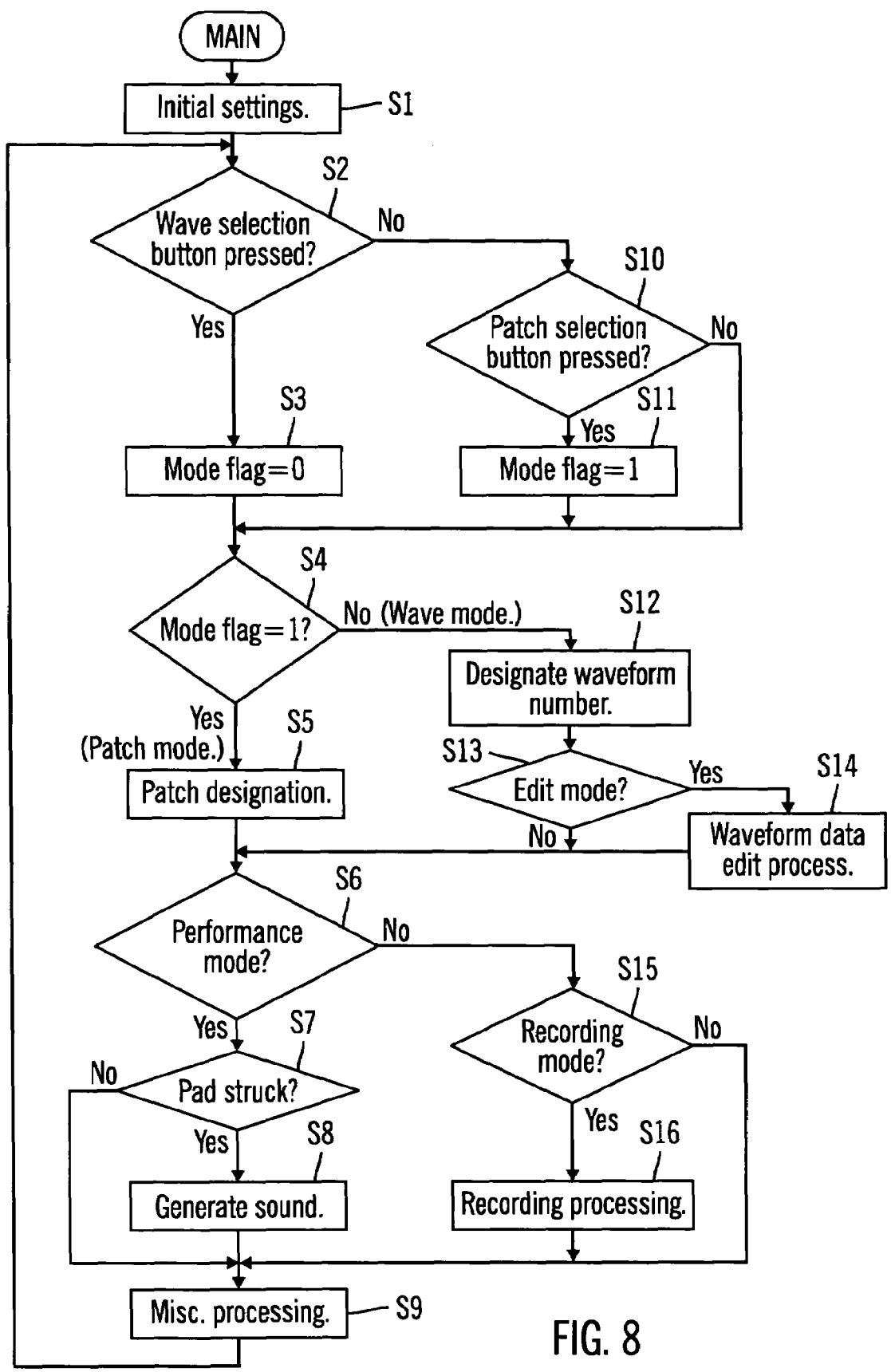
FIG. 8 is a flowchart showing main processing that is executed by the CPU.

FIG. 8 shows the main processing that is repeatedly executed by the CPU 1 by the electronic percussion instrument 100 of the preferred embodiment. When power is turned on, the program that executes the main processing is launched in the CPU 1. First, initial settings for each type of register and the like are carried out (S1). Incidentally, in the initial setting (S1), the electronic percussion instrument 100 is set to the performance mode and the patch mode (mode flag "1").

After the processing of S1, it is then determined whether the wave selection switch 24 has been pressed (S2). If the wave selection switch has been pressed (S2: yes), the mode flag is set to "0" (S3). The mode flag is typically provided in the RAM 3 and indicates whether the electronic percussion instrument 100 is set to patch mode or wave mode. When wave mode has been selected by the pressing of the wave selection button 24, the mode flag is set to "0", and when patch mode has been selected by the pressing of the patch selection button 23, the flag is set to "1." After the mode flag has been set to "0" by the processing of S3, processing proceeds to the processing of S4.

On the other hand, if the wave selection switch 24 has not been pressed (S2: no), it is then determined whether the patch selection button 23 has been pressed (S10). If the patch selection switch 23 has been pressed (S10: yes), the mode flag is set to "1" (S1) and the processing proceeds to the processing of S4. On the other hand, if the patch selection switch 23 has not been pressed (S10: no), in other words, if neither the wave selection switch 24 nor the patch selection switch 23 has been pressed, the current state of the mode flag is maintained and the processing proceeds to the processing of S4.

In the processing of S4, it is determined whether the mode flag is "1." If the mode flag is "1," indicating patch mode (S4: yes), one of the patches that is used from among the patch group (refer to FIG. 4) that is stored in the waveform memory 4 is designated (selected) by means of a specified operation (S5) and the processing proceeds to the processing of S6. On the other hand, if the mode flag is "0," indicating wave mode (S4: no), the waveform number with which the sound is produced during the performance mode or the waveform number for the assignment to the waveform data that are recorded during the recording mode is designated (S12). After the processing of S12, it is determined whether the edit mode has been selected by the mode selection button 25 (S13). If the edit mode has been selected (S13: yes), the waveform data edit processing (S14), which will be discussed later, is executed. The waveform data edit processing (S14) is used to edit the positions of the readout start address (SP) and/or the readout end address (EP) in the waveform data that are stored in the waveform memory 4 (refer to FIG. 12).

Processing proceeds to the processing of S6 after the processing of S14, or if the result of the processing of S13 is that the edit mode has not been selected (S13: no). In the processing of S6, it is determined whether the electronic percussion instrument 100 is in the performance mode. If the instrument is in performance mode (S6: yes), it is determined whether a pad 7 (one from among 7a through 7i) has been struck (S7). If a pad 7 has not been struck (S7: no), the processing proceeds to the processing of S9. On the other hand, if a pad 7 has been struck (S7: yes), a musical tone is generated from the waveform data in the DSP 10 in conformance with the setting of the patch mode or the wave mode, a sound is emitted (S8) via a speaker or the like connected to the output terminal (a portion of the D/A 12), and processing proceeds to the processing of S9.

On the other hand, if the instrument is not in performance mode (S6: no), it is determined whether the instrument is in recording mode (S15). If the instrument is in recording mode (S15: yes), the recording processing (FIG. 9), which will be discussed later, is carried out in conformance with the settings of the patch mode or the wave mode (S16).

Figure 9:
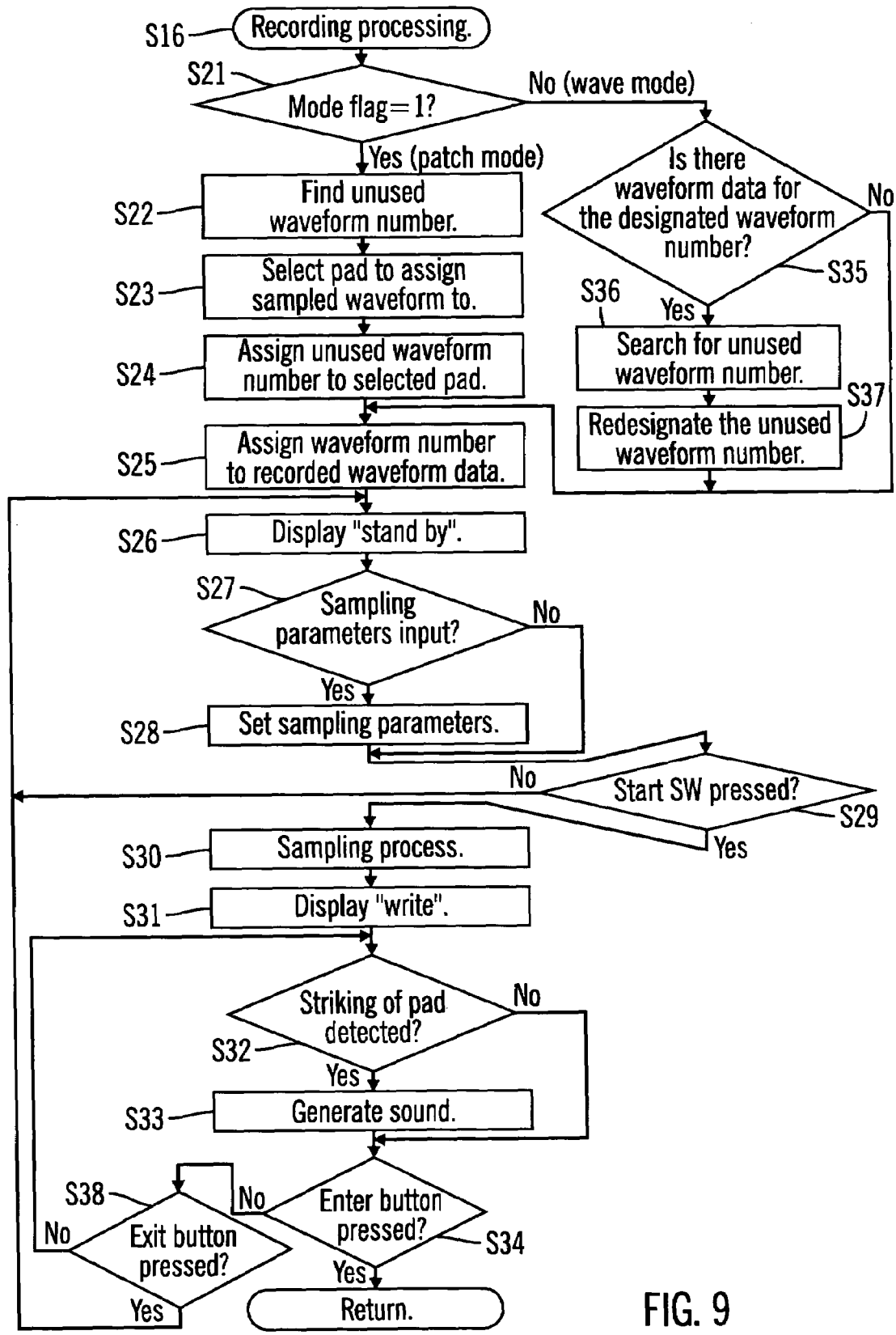
FIG. 9 is a flowchart of recording processing that is executed by the CPU.

The recording or sampling processing is now discussed with reference to FIG. 9. Incidentally, in those cases where sampling of waveform data in the electronic percussion instrument 100 is carried out, a device (such as a CD player, another electronic musical instrument, and the like), which is an input sound source, is connected to an input jack that is not shown in the drawing to provide the waveform to be sampled.

In the recording processing (S16), it is first determined whether the mode flag is "1" (S21). If the mode flag is "1," in other words, that it is the patch mode (S21: yes), the waveform list 30 in the waveform memory 4 is referred to and an unused waveform number (a waveform number that is not used for waveform data) is searched for (S22). The search is carried out in order from the smallest waveform number and the first unused waveform number is acquired. Incidentally, in those cases where the result of the search that is carried out in the processing of S22 is that there are no unused waveform numbers, a notification to that effect is provided.

After the processing of S22, the user selects one of the pads from among the pads 7a through 7i as the pad to which the waveform data will be assigned (S23). This may be carried out by striking one of the pads 7a through 7i to which it is desired to assign the waveform data, or selecting a pad number 1 through 9 on the LCD 9 using the DEC button 21 and the INC button 22.

After the processing of S23, the waveform number that has been searched for and acquired in the processing of S22 is assigned to the pad that has been selected in the processing of S23 (S24). By means of the processing of S24, when, after the completion of the recording processing (S16), a pad that has been selected by the processing of S23 of a patch that has been designated by the processing of S5 has been struck in the performance mode, the waveform data that correspond to the waveform number that has been assigned (is affiliated with) that pad are read out from the waveform memory 4 and a sound is emitted from a speaker and the like that has been connected to the output terminal (a portion of the D/A 12). After the processing of S24, the processing proceeds to the processing of S25.

On the other hand, if the mode flag is "0" (the wave mode; S21: no), the waveform list 30 in the waveform memory 4 is used to determine whether there is waveform data for the waveform number that has been designated in the processing of S12 (S35). If there is waveform data for the designated waveform number (S35: yes), the waveform list 30 in the waveform memory 4 is referred to again and a search is made for an unused waveform number (S36). In the processing of S36, the waveform number that has been found first by carrying out a search in order from the smallest waveform number is designated (S37) as the waveform number for assignment to the sampled waveform data and processing proceeds to the processing of S25. Incidentally, in those cases where the result of the search that has been carried out in the processing of S36 is that there are no unused waveform numbers, a notification to that effect is displayed.

On the other hand, if the waveform number designated in the processing of S12 is already being used as a waveform number (S35: no), the processing skips the processing of S36 through S37 and proceeds to the processing of S25.

In the processing of S25, the assignment of a waveform number to sampled waveform data is carried out. Incidentally, in the processing of S25, if the recording is done in patch mode, the waveform number that has been searched for and acquired by the processing of S22 is assigned to the waveform data that are recorded. On the other hand, for recording in wave mode, in those cases where the waveform number in the processing of S39 is designated again, the waveform number that has been redesignated is assigned, and in all other cases the waveform number that has been designated in the processing of S12 is assigned.

Consequently, when sampling is done in wave mode, the waveform is either assigned a wave number designated by the user, allowing the user to easily recognize the waveform by its wave number, or if necessary is automatically assigned an unused number, eliminating the need for the user to identify an unused number. Further, when sampling is done in patch mode, the waveform number assigned to the sampled waveform data is also assigned to a specified pad within a specified patch, allowing the sampled waveform to be automatically added to a patch at the time of sampling. This eliminates complicated work of separately assigning the waveform data to pad and to a patch as required by prior art devices.

Returning to FIG. 9, after the assignment of a waveform number for sampled waveform data, a standby message is displayed on the LCD 9 (S26). Adjustment of the input waveform may also be done at this time.

While the standby message is displayed, it is determined whether sampling parameters have been input by the user (S27). If sampling parameters have been input (S27: yes), the input sampling parameters are set (S28) and processing proceeds to the processing of S29. The sampling parameters that are input in the processing of S27 are the "start level (Start Lvl)", the "tempo (Tempo)", and the "beat (Beat)." The user inputs these parameters by the operation of the page L button 26, the page R button 27, and the DEC button 21 and the INC button 22. The "start level" sets the threshold of the input level with which the recording is started; when the level of the input waveform data exceeds the threshold value after the start SW 20 is pressed, the writing of the waveform data to the waveform memory starts. In this preferred embodiment, the "start level" is configured such that a value of "1" to "14" or Off (in other words, "0") can be specified. The "tempo" represents the tempo value of the input waveform in musical time, such as the number of quarter notes per minute. Preferably a value of "20" to "260" can be specified. The "beat" represents the number of beats that are contained in one bar of the input waveform. Preferably a value of "2" to "4" can be specified.

Returning to FIG. 9, if it is determined at S27 that there has been no input of the sampling parameters (S27: no), processing skips to the processing of S29. Incidentally, the "Stby" display and the display of the sampling parameters and the like that are shown on the LCD 9 in S26 through S27 continue to be displayed until the start SW 20 is pressed in the processing of S26, which will be discussed later.

In the processing of S29, it is determined whether the start SW 20 has been pressed, in other words whether the start/stop SW 20 has been operated to be On. If the start SW 20 has not been pressed (S29: no), processing returns to the processing of S26, and if a modification of the settings for the sampling parameters has been input, the setting modifications are carried out with the standby display unchanged and the system waits for the pressing of the start SW 20. When the start SW 20 is pressed (S29: yes), an instruction is given to the DSP 10 to begin sampling the input waveform (S30).

The sampling processing is now discussed with reference to FIG. 10 and FIG. 11. FIG. 10 shows the temporal relationship between the timing 52 in which the start SW 20 has been pressed during the waveform sampling 51, the position of the musical break or end point (EP) 53 of the waveform, and the recording stop position or end address (EA) 54 of the waveform. FIG. 10(a) shows the positions of the EP 53a and the EA 54a for which the sampling 51 is carried out when the stop SW 20 is pressed at a point 52 that is at or prior to the intermediate point 58 of the musical bar between line 56 and line 57. FIG. 10(b) shows the positions of the EP 53b and the EA 54b for which the sampling 51 is carried out when the stop SW 20 is pressed at a point 52 that is later than the intermediate point 58 of the musical bar between line 56 and line 57. FIG. 10(c) shows alternative positions of the EP 53c and the EA 54c for which the sampling 51 is carried out when the stop SW 20 is pressed at a point 52 that is later than the intermediate point 58 of the musical bar between the line 56 and the line 57.

Figure 11:
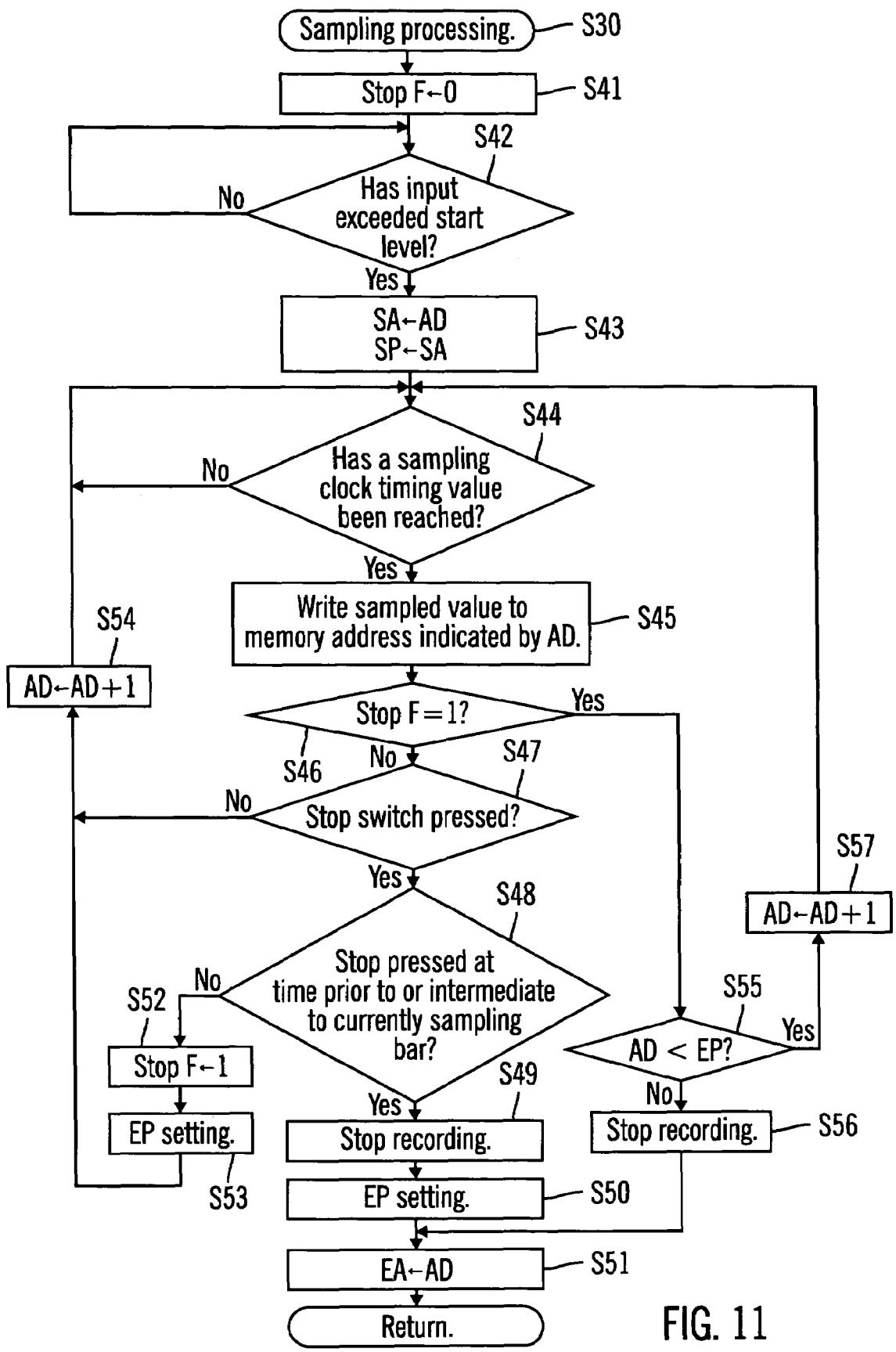
FIG. 11 is a flowchart of sampling processing that is executed by the CPU.

FIG. 11 is a flowchart that shows the sampling processing that is executed in the processing of S30. In the sampling processing (S30), first the stop flag (Stop F) is set to "0" (S41). The stop flag is provided in the RAM 3 and indicates whether the stopping of the sampling has been instructed by the pressing of the stop SW 20. The stop flag is set to "0" for each launch of the sampling processing by the pressing operation of the start SW 20 as discussed above and is set to "1" when the stopping is instructed by pressing the stop SW 20.

After the processing of S41, it is determined whether the input level of the input signal (the waveform data) has exceeded the start level that has been set in the processing of S28 (S42). If the input level of the input signal does not exceed the start level that has been set (S42: no), the processing returns to the processing of S42 and stands by for the input level to exceed the start level. On the other hand, if the input level of the input signal has exceeded the start level that has been set (S42: yes), the current address AD is set to the start address SA, and the start address SA is set to the start point SP (S43). The values of the SA and the SP that have been set by the processing of S43 are stored in the waveform list 30 in the waveform memory 4 as the waveform parameters that correspond to the waveform number that has been assigned to the relevant waveform data by the processing of S25.

After the processing of S43, it is determined whether a sampling clock timing value has been reached (S44). In accordance with the sampling clock timing, the value of the sampling flag is set to "1" in each sampling cycle by a sampling clock generation circuit, thus providing the timing with which the sampling of the waveform data is carried out. If the sampling clock timing value has not been reached (S44: no), the processing returns to the processing of S44 and stands by for the sampling clock timing value to be reached. On the other hand, if the sampling clock timing value has been reached (S44: yes), the current amplitude value of the waveform data is obtained from the A/D converter 11 and is written to the memory at a current address AD (S45).

After the processing of S45, it is determined whether the value of the stop flag is "1" (S46). If the value of the stop flag is not "1," in other words, if the stop SW 20 has not previously been pressed (S46: no), it is determined whether stop SW 20 has been pressed (S47). If the stop SW 20 has not been pressed (S47: no), the address AD advances "1," the next address is made the current address (S54) and processing proceeds to the processing of S44.

On the other hand, if a pressing operation of the stop SW 20 is confirmed (S47: yes), it is determined whether the timing 52 of the pressing of the stop SW 20 is prior to the intermediate point 58 (including the intermediate point 58) of the musical bar being sampled (S48).

An explanation will be given here regarding the method with which the timing 52 and the intermediate point 58 are compared while referring to FIGS. 10(a) and 10(b). When the sampling frequency (the number of addresses that are sampled per second) is set to a value "S," the tempo value (the number of quarter notes per minute) is set to a value "T," and the beat count, in other words, the number of quarter notes contained in one bar, is set to a value "B," the number of addresses contained in one bar is calculated by means of the following formula:

$$\text{(the number of addresses contained in one bar)} = 60*S*B/T \quad (1)$$

In the preferred embodiment, the value of the sampling frequency "S" is 44.1 kHz, and the tempo value "T" and the beat count "B" are values that have been set by the processing of S28 discussed above.

Next, the value of the address for the timing 52 at which the stop SW 20 has been pressed is set to the value "AD" and the number of bars "N" from the start of the sampling to the currently sampled bar 55 as well as the address "X" of the intermediate point 58 are calculated by means of the following formulas:

$$N = \text{the integer of } [(AD-SP)/(60*S*B/T)] \quad (2)$$

$$X = [(N*2+1)/2]*(60*S*B/T)+SP \quad (3)$$

In the processing of S48, it is determined whether the value of the address for the timing 52 at which the stop SW 20 has been pressed is at or prior to the address of the intermediate point 58 that has been calculated based on the above mentioned formula (3). If the stop SW 20 has been pressed at a time 52 that is prior to the intermediate point 58 of the current bar (S48: yes), an instruction is issued to the DSP 10 that the recording is to be stopped at the address corresponding to the time 52 and the recording is stopped (S49). After the processing of S49, the setting of the EP (end point) is carried out (S50). In the processing of S50, as is shown in FIG. 10(a), in those cases where the time 52 at which the stop SW 20 has been pressed and operated is prior to intermediate point 58 (including the intermediate point 58) of the current bar, the processing sets the end point EP

53a. In the processing of S50, the EP (the EP 53a) is calculated by means of the following formula:

$$EP = N*(60*S*B/T) + SP \quad (4)$$

The value of the EP 53a that has been calculated based on the above mentioned formula (4) is made a waveform parameter that corresponds to the waveform number that has been assigned to the relevant waveform data by the processing of S25. The value is stored in the waveform list 30 in the waveform memory 4 and the processing (S50) for setting the EP is completed. After the processing of S50, the current address AD, in other words, the address of the timing 52 at which the recording by the processing of S49 has been stopped, is set as the end address (EA) 54a, and the EA that has been set is stored in the waveform list 30 in the waveform memory as a waveform parameter that corresponds to the waveform number that has been assigned to the waveform data by the processing of S25. After the processing of S51, the sampling processing (S30) is stopped.

On the other hand, if the time 52 is later than the intermediate point 58 of the current bar (S48: no), the value of the stop flag is set to "1" (S52) and the setting of the EP is carried out (S53). In the processing of S53, as is shown in FIG. 10(b), in those cases where the timing 52 from the pressing operation of the stop SW 20 is later than the intermediate point 58 of the bar 55, the processing sets the end point EP 53b. Here, in the processing of S53, the EP (EP 53b) is calculated by means of the following formula:

$$EP = (N+1)*(60*S*B/T) + SP \quad (5)$$

The value of the EP 53b that has been calculated based on the above mentioned formula (5) is stored in the waveform list 30 in the waveform memory 4 as a waveform parameter that corresponds to the waveform number that has been assigned to the relevant waveform data by the processing of S25 and the processing for setting the EP (S53) ends. After the processing of S53, the current address AD advances "1" and is made the next address (S54) and the processing proceeds to the processing of S44. In those cases where the time 52 of the pressing operation of the stop SW 20 is coincidental with the end of a bar such as indicated by the bar line 56 or 57, the address corresponding to the time 52 is used as the EP 53 and the EA 54.

On the other hand, if the result that has been ascertained by the processing of S46 is that the value of the stop flag is "1," in other words, that it is a state in which the stop SW 20 has already been pressed (S46: yes), it is determined whether the current address AD has reached the address EP (the EP 53b) that has been set by the processing of S63 (S55). If the address AD has not reached the address EP that has been set by the processing of S53, in other words, that AD<EP (S55: yes), AD is advanced "1" and made the next address (S57) and the processing proceeds to S44. In addition, if the current address AD has reached the address EP that has been set by the processing of S53 (S55: no), an instruction is issued to the DSP 10 to stop the recording and the recording stops (S56). After the processing of S56, the processing proceeds to the processing of S51, the current address AD is set as the end address (EA) 54b, and the EA that has been set is stored in the waveform list 30 in the waveform memory 4 as a waveform parameter that corresponds to the waveform number that has been assigned to the relevant waveform data by the processing of S25. After the processing of S51, the sampling processing (S30) ends.

By means of the processing of S50 or S53 of the sampling processing (S30) discussed above, the position of a musically suitable break is set as the end point EP 53 of the sampled waveform based on the time at which the stop SW 20 is pressed. If the stop SW 20 is pressed before or at the intermediate point 58 of the currently sampled bar, the end point EP is set as the end of the previous bar. On the other hand, if the stop SW 20 is pressed after the intermediate point 58 of the currently sampled bar 55, the end point EP is set as the end of the currently sampled bar, and the rest of the bar is sampled. Therefore, even if the time of the pressing of the stop SW 20 is not at the precise position with respect to the currently sampled bar, it is possible to automatically set a musically suitable break for the sampled waveform as the end point based on the tempo value and the beat count that have been set in advance. Accordingly, there is no need for the user who is carrying out the sampling to precisely stop the sampling at a desired point.

The preferred embodiment sets the end point EP as shown in FIG. 10(b) when the stop SW 20 is pressed after the intermediate point of the current bar. However in alternative embodiments processing may be performed as shown in FIG. 10(c) such that an additional portion of the waveform after the end of the bar is also recorded. As shown in FIG. 10(c), when the stop SW 20 is pressed at a time later than the intermediate point 58 of the currently sampled bar, recording continues for a predefined amount (for example, 10,000 addresses) after the end of the bar. The recording then stops, the address of the recording stop position 54c is set as the end address, and the address that corresponds to the end of the bar is set as the end point EP 53c. In this case, in the sampling processing of FIG. 11 is configured such that, if it has been ascertained in the processing of S55 that the current address AD has reached the EP (AD=EP), the EP is set to AD (the current address is made the EP). In addition, after recording has continued for a predefined amount, the recording stop address AD is made the end address (the EA). Incidentally, in this case, it may also be configured such that, when a pad that has been affiliated with the waveform data that have been sampled is struck, the waveform data that are between the start point SP (or the start address SA) and the EP 53c are emitted.

Explanation of further features is now given, returning to FIG. 9. When the sampling processing (S30) discussed above ends, the electronic percussion instrument 100 automatically switches the operating mode from the recording mode to the performance mode and, together with this, a "write?" message is displayed on the LCD 9 to prompt the user to indicate whether to save the waveform data that have been recorded (S31). Incidentally, in the processing of S34 or S38, which will be discussed later, the waveform data that have been recorded are saved when the Enter button 31 is operated by the user and the waveform data that have been recorded are deleted without being saved when the Exit button 30 is operated. Incidentally, the "write?" display that is displayed by the LCD 9 in the processing of S31 is displayed continuously until the Enter button 31 or the Exit button 30 is operated in the processing of S34 or S38, which will be discussed later.

After the processing of S31, it is determined whether a striking of a pad 7 has been detected (S32). In further detail, in the processing of S32, if the recording is in the patch mode, it is determined whether the struck pad is a pad that was selected in the processing of S23, and if the recording in the wave mode, it is determined whether a striking of one of the pads 7a through 7i has been detected. If the striking of a pad has been detected (S32: yes), the waveform data that have been recorded in the processing of S30 are read out from the waveform memory 4 to the DSP 10 and a sound is produced from a speaker connected to the output terminal (a portion of the D/A 12; S33). By means of the processing of S32 through S33, it is possible to ascertain the sound (the musical tone) of the waveform that has been sampled. After the processing of S33, the processing proceeds to the processing of S34. On the other hand, if the striking of a pad has not been detected (S32: no), the processing of S33 is skipped and processing proceeds to the processing of S34.

In the processing of S34, it is determined whether the Enter button 31 has been pressed. If the Enter button 31 has been pressed, indicating that saving of the waveform data is desired by the operator (S34: yes), the recording processing (S16) ends and the processing returns to the main processing. On the other hand, if the Enter button 31 has not been pressed (S34: no), it is determined whether the Exit button 30 has been pressed (S38). If the Exit button 30 has been pressed, indicating that saving is not desired by the operator (S38: yes), the operating mode is automatically switched from the performance mode to the recording mode and, together with this, the waveform data that have been recorded in the processing of S30 and stored in the waveform memory 4 are deleted. In addition, the waveform parameters that correspond to the waveform number in the waveform list 30 are deleted. After the deletion of the waveform and the corresponding waveform parameters, the processing proceeds to the processing of S26 and a new recording is executed. Incidentally, the waveform number that has been assigned in the processing of S25 can be used for the new waveform data. Accordingly, each type of waveform parameter for the waveform data that have been recorded again is stored anew for the relevant waveform number in the waveform list 30. On the other hand, if the Exit button 30 has not been pressed (S38: no), processing returns to the processing of S32 and stands by for execution of one of either the detection of the striking of a pad 7, or the pressing of the Enter button 31, or the pressing of the Exit button 30.

The waveform parameters "SP" and "EP" that are obtained for sampled waveform data may be edited by the waveform editing processing (S14) as required. The waveform data editing processing (S14) is now discussed with reference to FIG. 12.

Figure 12:
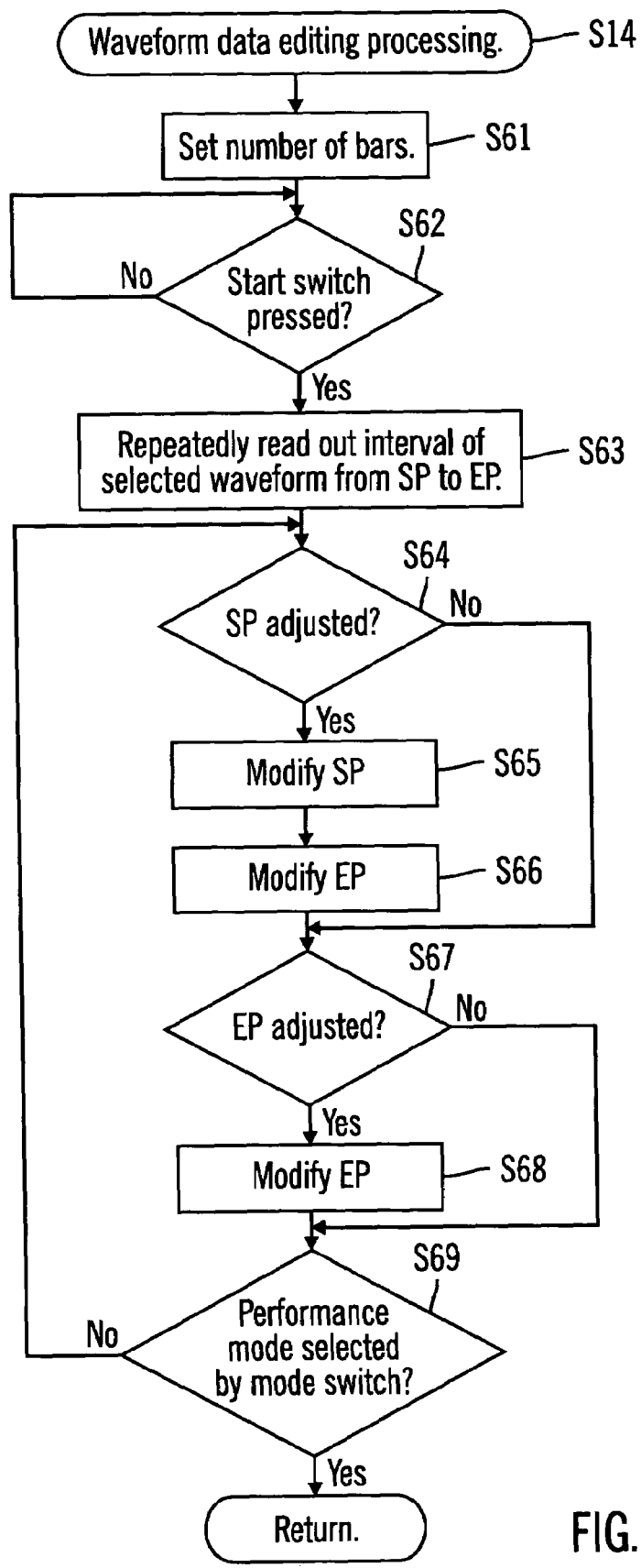
FIG. 12 is a flowchart of editing processing that is executed by the CPU.

FIG. 12 is a flowchart that shows the waveform data editing processing. In the waveform data editing processing (S14), first the setting of the number of bars is carried out by the operation of the page L switch 26, the page R switch 27, the DEC button 21 and the INC button 22 (S61). After the processing of S61, it is determined whether the start SW has been pressed (S62). If the start SW 20 has not been pressed (S62: no), the processing returns to the processing of S62 and stands by for the processing of the start SW 20. On the other hand, if the start SW 20 has been pressed (S62: yes), the segment between the SP and the EP for the waveform data of the waveform number that has been selected in the processing of S12 is repeatedly read out from the waveform memory 4 only for the number of bars that have been set by the processing of S61 (S63).

After the processing of S63, it is determined whether the SP of the waveform data that have been read out has been adjusted manually such that it is at a musically appropriate break position (S64). The manual adjustment, here, of the SP is carried out by selecting the "start point," which is a parameter that is displayed on the LCD 9, by means of the page L switch [sic] 26 or the page R switch [sic] 27 and operating the DEC button 21 or the INC button 22 while listening to the performance. If the SP has been adjusted manually (S64: yes), the SP in the waveform list 30 is set to the SP that has been modified by the adjustment (S65), recalculation of the EP is carried out based on the modified SP and the number of bars that has been set by the processing of S61, and the value of the EP is modified based on the results of the recalculation (S66). Here, if the number of bars that has been set by the processing of S61 discussed above is made "M," the new EP is calculated based on the following formula:

$$EP=M*(60*S*B/T)+SP \qquad (6)$$

In those cases where there is an offset between the position of the SP that has been set by the sampling processing of S30 discussed above (FIG. 11) and the position of a musically appropriate break, there will be a corresponding offset between the position of the EP that has been set by the processing of S50 or S63 and the position of a musically appropriate break. By means of the processing of S65 through S66, the correction of the SP to a musically appropriate position results in the automatic correction of the EP to a musically appropriate position.

After the processing of S66, the processing proceeds to the processing of S67. On the other hand, if no adjustment of SP has been carried out (S63: no), the processing of S65 through S66 is skipped and processing proceeds to the processing of S67.

In the processing of S67, it is determined whether an adjustment has been made manually to the EP so as to make the break position musically appropriate. In those cases where the tempo value that has been set during the sampling of the waveform data does not correspond exactly to the tempo of the input waveform, the location set for the EP will be offset from the musically appropriate end break, requiring manual adjustment. The manual adjustment of the EP here is carried out by selecting the parameter "end point" by means of the operation of the page L button 26 or the page R button 27 and operating the DEC button 21 or the INC button 22 while listening to the performance.

If the result that has been ascertained by the processing of S67 is that the EP has been manually adjusted (S67: yes), the EP in the waveform parameters for the corresponding waveform data in the waveform list 30 is modified to the EP that has been modified by the adjustment (S68) and it is determined whether the performance mode has been selected by the pressing operation of the mode SW 25 (S69). On the other hand, if no adjustment of the EP has been carried out (S67: no), the processing of S68 is skipped and processing proceeds to the processing of S69. If processing mode has not been selected (S69: no), the processing shifts to the processing of S64. On the other hand, if performance mode has been selected by the processing of S69 (S69: yes), the waveform data editing processing (S14) ends and the processing returns to the main processing.

By means of the waveform data editing processing discussed above (S14), when the operator makes an adjustment manually to the waveform data that have been recorded in accordance with the sampling processing (S30), the EP is automatically calculated and reset based on the SP that has been modified by the adjustment and the number of bars that has been set in advance. Therefore, during the recording or the editing of the waveform data, since a musically appropriate break position is automatically set as the end point (the readout end address) based on the specified parameters that have been set in advance and separately from the end address of the waveform data (the recording stop address), it is convenient in those cases where the waveform data that have been recorded are used as the raw material for a performance or a composition and the like.

Explanation of further processing is now given, returning to FIG. 8. After the recording processing (S16), the processing proceeds to the miscellaneous processing (S9), which will be discussed below. Then, after the miscellaneous processing of S9, the processing proceeds to the processing of S2 and the entire main processing is repeated and executed.

In the miscellaneous processing (S9), the wave information processing (FIG. 14), which will be discussed later, the selection processing for the operating mode (the performance mode, the recording mode, and the like) by means of the mode selection button 24, or processing that corresponds to another operator such as a volume control and the like and processing that corresponds to other operating modes, display processing for the display device 9, MIDI related processing, and the like are carried out.

Here an explanation will be given regarding the miscellaneous processing (S9) that is executed in the electronic percussion instrument 100 while referring to the flowchart of FIG. 13. In addition, from among the miscellaneous processing (S9), an explanation will be given, in particular, regarding the wave information processing, in which the waveform number assignment status to the pads is retrieved, while referring to the flowcharts of FIG. 14 through FIG. 15.

Figure 13:
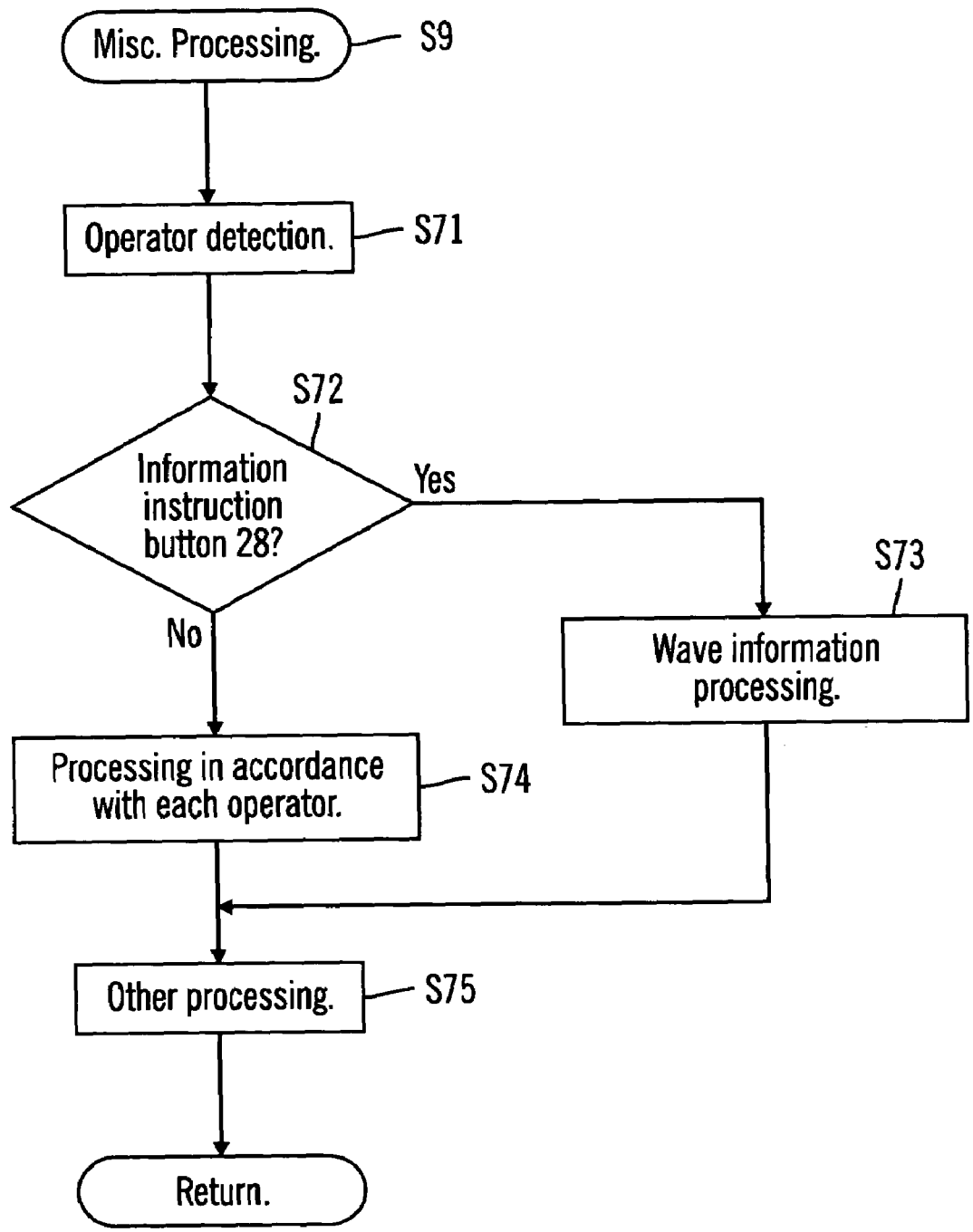
FIG. 13 is a flowchart of miscellaneous processes that are executed by the CPU.

FIG. 13 is a flowchart that shows the miscellaneous processing (S9) in the main processing of the electronic percussion instrument 100. In the miscellaneous processing (S9), first the operating condition of the operators 6 is detected (S71) and it is determined whether, among other things, the information instruction button 28 has been operated (S72). If the information instruction button 28 has been operated (S72: yes), the wave information processing, which will be discussed later, is executed (S73). In those cases where the information instruction button 28 has not been operated (S73: no), processing that corresponds to the other operations of the operators 6, such as the selection of the operating mode by means of the mode selection button 25 or volume adjustment and the like, is carried out (S74) and in those cases where none of the operators has been operated, no processing in particular is done in the processing of S74, and processing advances to the processing of S75. Incidentally, since the wave information processing is processing for displaying on the LCD 9 and the pad indicator 29 the usage status of the waveform numbers for any waveform data that have been set in advance by the operation of the wave selection button 24, in those cases where no waveform numbers have been selected in advance, the processing advances to the processing of S74 without executing the wave information processing.

In the processing of S75, processing that corresponds to other operating modes, display processing for the display device 9, and MIDI related processing are executed. After the processing of S75, the miscellaneous processing (S9) ends and the processing returns to the main processing. In the main processing, when the miscellaneous processing (S9) ends, the processing proceeds to the processing of S2 and the entire main processing is repeated and executed.

Figure 14:
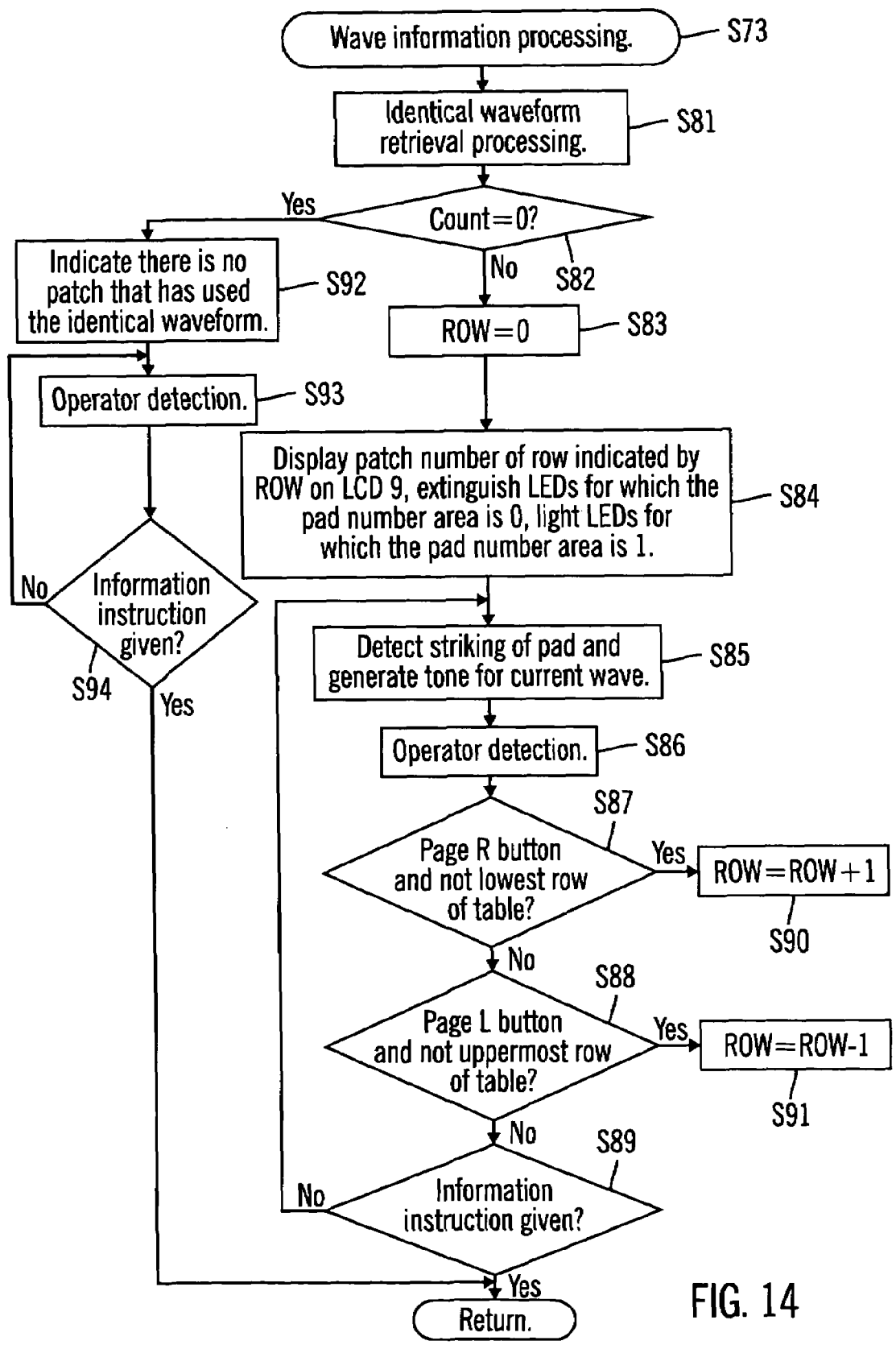
FIG. 14 is a flowchart that shows wave information processing that is executed by the CPU.

FIG. 14 is a flowchart that shows the wave information processing. In S73 of the miscellaneous processing (S9) of the main processing, when an instruction is issued to execute the wave information processing, an instruction is issued for the execution of the identical wave retrieval processing (S81). This retrieves information about a specified waveform from the waveform list 30 and produces a Table (not shown) such as the table of FIG. 6a or 6b that shows every pad of every patch for which a specified waveform has been designated. When the identical waveform retrieval processing of S81 ends, it is determined whether the value of the register COUNT is "0" (S82). Here, COUNT is a register that indicates the number patches in which the specified waveform is present. The value of this register is set during identical wave retrieval processing (S81). A value of "0" indicates that no patch contains the specified waveform (S82: yes). In this event, an instruction is issued such that the retrieval result is displayed on the LCD 9 and the like (S92). This display may be one that displays, for example, "Not Found" or the like on the LCD 9 screen. After that, detection of the operators is carried out (S93) and it is determined whether the information instruction button 28 has been operated (S94). If the information instruction button 28 has not been operated (S94: no), the processing returns to the processing of S93 and stands by until an instruction for the completion of the wave information processing is issued. On the other hand, if the information instruction button 28 has been operated (S94: yes), the wave information processing (S73) ends and the processing returns to the miscellaneous processing (FIG. 13).

On the other hand, if the value of COUNT is other than "0" (S82: no), there is at least one patch that contains the specified waveform. In this event, first the value of the register ROW is made "0" as an initial value (S83). ROW is a register with which the designation of a row in a Table such as that of FIG. 6(a) or 6(b) that represents a patch. If the value of ROW is "0," this corresponds to the uppermost row of FIGS. 6(a) and 6(b). Incidentally, the setting of ROW in the processing of S83 may be done differently so that display begins at the lowermost row of the table. The value of ROW may also be set by the user.

When the value of ROW is set to "0," the LEDs of the pad indicator 29 are illuminated in correspondence with the flags in the pad number areas in the uppermost row of the Table. LEDs corresponding to pad number areas set to "0" are extinguished, and LEDs corresponding to pad number areas set to "1" are illuminated. In addition, an indication of the corresponding patch number is displayed on the LCD 9 screen (S84). For example, "Patch 001" is displayed.

When the display of the patch number and the pads is completed, it is determined whether there has been a striking of any of the pads, and in those cases where there has been a striking, a musical tone is generated and output by the DSP 10 based on the waveform number of the struck pad (S85). Since this processing is performed to enable the user to confirm the performance of the specified waveform number, the musical tone is generated in response to striking of any pad. Where no pad is struck, nothing is done and processing advances to the processing of S86.

Next, the operating status of the operators 6 is detected (S86) and, in those cases where the operation of the page R button 27 has been ascertained and, moreover, the value of ROW does not indicate the lowest row of the Table, (S87: yes), the value of ROW is increased by "1" to display the status of the next patch (S90), the processing returns to the processing of S84 and the display of the patch number and the pad number is carried out in conformance with the value of ROW. In those cases where the operation of the page L button 26 has been ascertained and, moreover, the value of ROW does not indicate the uppermost row of the Table (S88: yes), the value of ROW is decreased by "1" to display the status of the patch of the previous row (S91), the processing returns to the processing of S84 and the display of the patch number and the pad number is carried out in conformance with the value of ROW.

If neither the page R button 27 nor the page L button 26 has been operated, or when the page R button 27 or the page L button 26 has been operated but the value of ROW cannot be increased or decreased, it is not possible to advance to the display of another patch number and the pad number (S87: no, and S88: no), and so it is next determined whether the information instruction button 28 has been operated (S89).

In those cases where the information instruction button 28 has not been operated (S89: no), in order to continue to carry out the display of the patch number and pads, processing returns to the processing of S85 and the processing for the display of the patch number and pads is continued until the information instruction button 28 is operated. On the other hand, if the operation of the information instruction button 28 has been ascertained in the processing of S89 (S89: yes), the wave information processing (S73) ends and the processing returns to the miscellaneous processing (FIG. 14).

With the electronic percussion instrument of the present invention, by means of the wave information processing (S73) discussed above, when a waveform number is specified and the retrieval of waveform information is started by operation of the information instruction button 28, the usage status of the waveform number is displayed by the LCD 9 and the pad indicator 29. Accordingly, it is possible for the user to easily determine the assignment status of the waveform number to the pads without the need for complicated work such as ascertaining the waveform number for each patch and the like. In addition, the sound of the specified waveform number is generated in response to striking any of the pads, the sound of the waveform can be easily confirmed.

Figure 15:
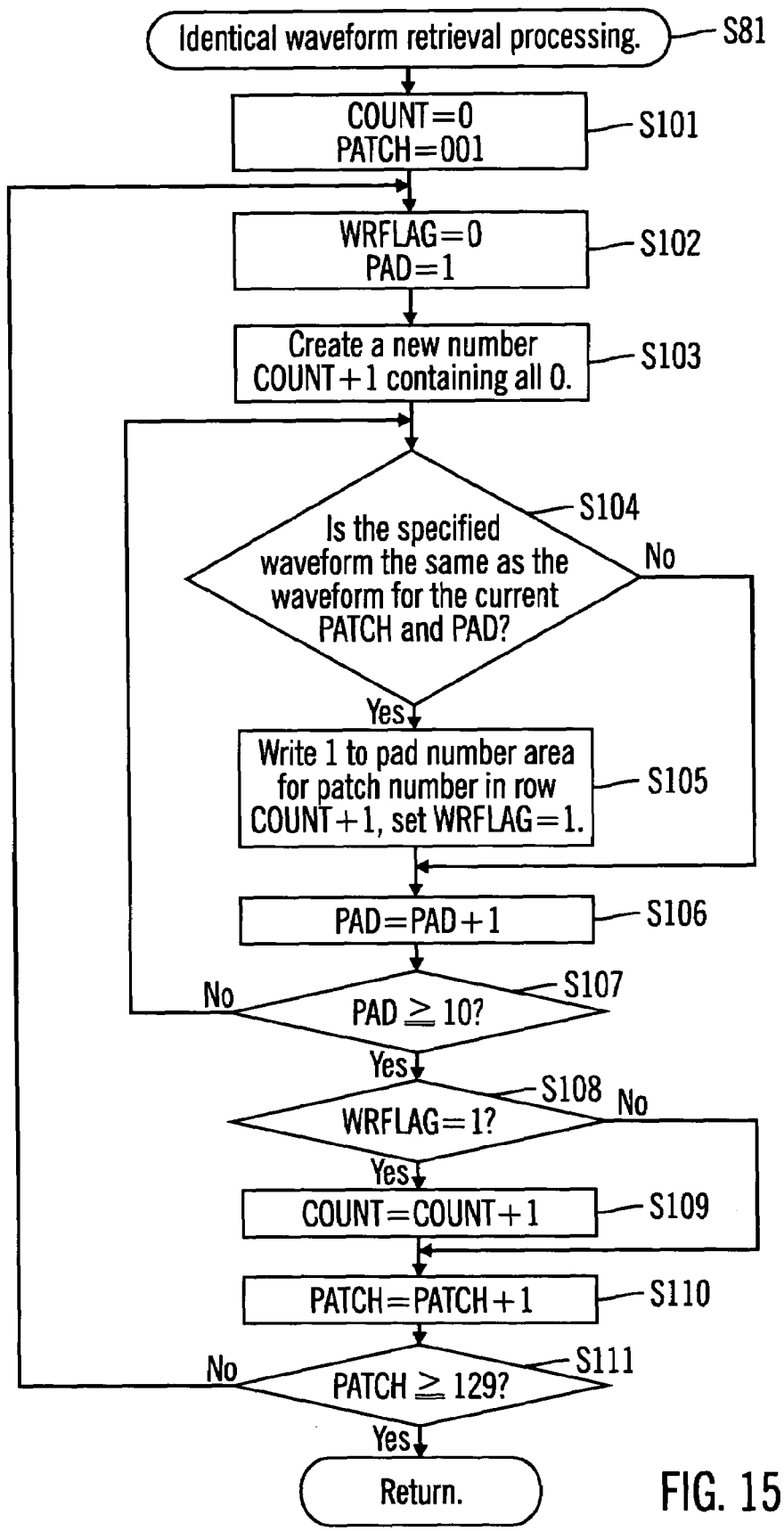
FIG. 15 is a flowchart that shows identical waveform retrieval processing that is executed by the CPU.

An explanation is now given regarding the identical wave retrieval processing (S81) while referring to FIG. 15. FIG. 15 is a flowchart that shows the identical waveform retrieval processing (S81) that is executed to retrieve information about a specified waveform number by operation of the wave selection button 24 and to produce a Table as described above in relation to waveform information processing.

As noted above, the performance of identical waveform processing is instructed when the user initiates wave information processing. When an instruction is issued for the execution of the identical waveform retrieval processing, the value of the register COUNT is initially set to "0," and the value of the register PATCH is initially set to "001." As stated above, COUNT indicates the number of patches that contain the specified wave number. PATCH is a register indicating the number of a patch for which pad and waveform information is being retrieved. After COUNT and PATCH are initialized, the flag WRFLAG is set to "0" and the register PAD is set to "1" (S102). WRFLAG is a flag that is set when the specified wave number is found in association with the patch for which information is currently being retrieved, indicating that at least one of the flags in the Table for that patch number will be set to "1" and consequently that there will be a row for that patch number in the Table. PAD is a register that denotes a pad number.

After the initialization of WRFLAG and PAD, processing is executed in which a row having a number (COUNT+1) is created and the flag in each field of the row is set to "0" (S103).

When each of the registers and each of the flags has been set to their initial values in the processing of S101 through S103, a determination is made as to whether the specified waveform is the same as the waveform that corresponds to the current values of PATCH and PAD (S104). This is determined by consulting a table such as that of FIG. 5. If the same waveform number is detected (S104: yes), the patch number that has been retrieved is written to the row number (COUNT+1), and "1" is written to the flag in that row that corresponds to the pad number, and in addition WRFLAG is set to a flag of "1" (S105). On the other hand, if the waveform number does not correspond to the waveform for the current patch and pad (S104: no), the processing advances to S106.

In the processing of S106, in order to retrieve the next pad number, the value of PAD is increased by "1" and it is determined whether the value of PAD has become "10" or greater (S107). In other words, in this preferred embodiment, since there are nine pads 7*a* through 7*i*, it is determined whether the value of PAD has exceeded 9. If PAD is less than 10 (S107: no), this means that retrieval has not been done for all pads of the patch, and so processing returns to the processing of S104 and the processing of S104 through S107 is repeated and executed until the retrieval has been done for all pad numbers. On the other hand, if the value of PAD is "10" or greater (S107: yes), retrieval has been done for all of the pads for the corresponding patch number, and processing advances to S108.

In the processing of S108, in order to determine whether any flags have been set in the row for the current patch, the flag WRFLAG is consulted. If WRFLAG has been set to "1" (S108: yes), flags have been set in the row, and so the value of COUNT is increased by one to indicate that the next row is the row to be written to (S109), and the processing advances to the processing of S110. If the flag has been set to "0" (S108: no), no flags have been set in the row, and so processing advances to the processing of S110.

In the processing of S110, in order to retrieve the next patch number, the value of PATCH is increased by "1" and it is determined whether the value of PATCH is "129" or greater. If the retrievals have been not been completed for all of the patches (S11: no), the processing returns to the processing of S102 and the processing of S102 through S111 is repeated and executed until the retrieval has been done for all of the patches. If the retrievals have been completed for all of the patches (S111: yes), the identical waveform retrieval processing (S91) ends and the processing returns to the wave information processing (FIG. 14).

Thus, by the processing of FIG. 15, a Table is created that indicates which pad of which patches are associated with a specified waveform number, and this Table may be used for displaying waveform information to the user in accordance with the processing of FIG. 14.

An explanation of the present invention has been given above based on a preferred embodiment; however, the present invention is not in any way limited to the preferred embodiment described above, and the possibility of various kinds of improvements and modifications that do not deviate from and are within the scope of the purport of the present invention can be easily conceived.

For example, in the preferred embodiment described above, in the processing of S38 of the recording processing (refer to FIG. 9), it is configured such that rerecording is carried out when the Exit button 30 is pressed but it may also be configured such that the recording processing is stopped by means of a specified operation. In this case, the recording is done in the sampling processing of S30 and the waveform data that have been stored in the waveform memory 4 are deleted. In addition, the waveform parameters that have been stored in the waveform list 30 for the waveform number that has been assigned in the processing of S25 are deleted.

In addition, in the recording processing in the preferred embodiment described above (refer to FIG. 9), it is configured such that, when the Exit button 30 is pressed, the rerecording is carried out after the parameters that correspond to the waveform data that have been recorded and stored in the waveform memory 4 are temporarily deleted. However, it may also be configured such that the waveform data and the corresponding waveform parameters that are stored in the waveform memory 4 are overwritten and updated at the time of the rerecording.

In addition, in the sampling processing in the preferred embodiment described above (refer to FIG. 11), the musically appropriate breaks that are set as the SP and the EP are determined in bar units but these may also be determined in other units of musical time such as beat. In this case, it would be configured such that the timing of the beat is specified by the tempo value.

In addition, in the sampling processing of the preferred embodiment described above (refer to FIG. 11), the settings are carried out in advance such that the waveform data that are sampled are affiliated with one of the pads 7a through 7i but it may also be configured such that the sampling is carried out without making pad affiliation settings.

In addition, in the processing of S45 of the sampling processing of the preferred embodiment described above (refer to FIG. 11), it is configured such that the amplitude values (the waveform amplitude values) that are AD converted for each sampling timing are stored in the waveform memory 4; however, instead of this, it may also be configured such that a buffer and a memory transfer circuit (DMA: direct memory access) not shown in the drawing are provided, and for each storage in the buffer of the amplitude values of a specified number (for example, 16 cycles) of waveforms that have been AD converted, an interruption is produced by the CPU 1 and the relevant memory transfer circuit transfers the data that are stored in the buffer to the waveform memory 4 with an instruction from the CPU 1.

In addition, in the sampling processing in the preferred embodiment described above (refer to FIG. 11), it has been configured such that the digital waveform amplitude value and the waveform parameters of the waveform data that have been recorded are stored in the waveform memory 4. Instead of this, it may also be configured such that after the data have been temporarily written to the RAM 3 at the time of sampling, they are stored in the waveform memory at the time of saving.

In addition, in accordance with the determination processing of S48 of the sampling processing described above (refer to FIG. 11), it is configured such that if the timing from the pressing of the stop SW 20 is at or before the intermediate point in the bar that is performed at that timing, the address that corresponds to the bar line that is the beginning of the relevant bar is made the end point and, on the other hand, if the timing is later than the relevant intermediate point, the address that corresponds to the bar line that is the end of the relevant bar is set as the end point. Instead of this, it may also be configured such that without depending on the performance position of the timing from the pressing of the stop SW 20, the address that corresponds to the bar line that is the beginning of the bar that is performed at the relevant timing is made the end point. Or else, it may be configured such that the address that corresponds to the bar line that is the end of the bar that is performed at the relevant timing is made the end point.

In addition, in the sampling processing in the preferred embodiment described above (refer to FIG. 11), it is configured such that prior to the start of the sampling by the operation of the start SW 20, the performance tempo and the beat count (the number of beats contained in one bar), the start address, and the start point are stored in the waveform list 30 as the waveform parameters; and, following this, together with the ending of the sampling by the operation of the stop switch SW 20, the end address and the end point are stored in the waveform list 30. Instead of this, it may be configured such that after the completion of the sampling, the start address, the start point, the end address, the end point, the performance tempo, and the number of bars are stored as a batch in the waveform list 30.

In addition, in the waveform data editing processing in the preferred embodiment described above (refer to FIG. 12), it has been configured such that the end point is set based on the number of bars that has been set by the processing of S61 and the tempo value and beat count (the number of beats contained in one bar) that have been set at the time of the recording (the sampling) of the waveform data that should be edited. Instead of this, it may also be configured such that the tempo value and the beat count (the number of beats in one bar) can again be input at the time of the waveform data editing processing.

In addition, in the waveform data editing processing in the preferred embodiment described above (refer to FIG. 12), it has been configured such that the end point is set based on the number of bars, the tempo value, and the beat count (the number of beats contained in one bar), but it may also be configured such that instead of the number of bars and the beat count (the number of beats contained in one bar), the total number of beats determined by the number of bars and the number of beats contained in one bar (the beat count) are set and input and the end point is set based on the total number of beats and the tempo value.

In addition, in the preferred embodiment described above, the sampling frequency has been used in order to calculate the address of the end point but it may also be configured such that the calculation is done using the sampling period (the reciprocal of the sampling frequency).

In addition, in the preferred embodiment described above, it has been configured with the sampling frequency made 44.1 kHz, but it may also be set up such that the sampling frequency is set for each set of waveform data. In addition, in this case, it may also be configured such that the sampling frequency for each set of waveform data is stored in the waveform list and the like.

In addition, in the wave information processing in the preferred embodiment described above (refer to FIG. 14), it has been set up such that, when the information instruction button 28 is operated, the retrieval of the waveform numbers for all of the patches is carried out, but it may be set up such that the retrieval is done for only one patch and those results are displayed. In this case, for each operation of the operators such as the page R button 27 and the page L button 26, the patch number is modified and the retrieval done. In addition, it may also be set up such that a range of patch numbers for retrieval is set up and the retrieval carried out.

In addition, in the wave information processing of the preferred embodiment described above (refer to FIG. 14), it has been configured such that the switching of the display in those cases where the result of the retrieval of the waveform number that has been selected is used for a plurality of patches is toggled by the operation of the page R button 27 and the page L button 26. Here, it may also be configured such that in those cases where the retrieval result indicates that the waveform number is affiliated with a plurality of patches, display lights (for example, LEDs) are provided that instruct the direction that corresponds to the operation of the page R button 27 and the page L button 26, which switch the display for each patch, and the fact that a plurality of patches exist is suggested to the operator by the lighting of the display lamps. In addition, it may also be set up such that illuminated type buttons are used for the page R button 27 and the page L button 26 themselves.

In addition, in the wave information processing in the preferred embodiment described above (refer to FIG. 14), it is configured such that only the waveform number is assigned to the pad but it may be configured such that a plurality of parameters is included. Furthermore, it may be configured such that the waveform numbers that include the parameters are made into one group with identification numbers appended and the identification numbers are assigned to each of the respective pads.

In addition, in the wave information processing in the preferred embodiment described above (refer to FIG. 14), it has been set up such that only the patch number and the pad number are displayed but it may also be set up such that various kinds of information other than that are displayed. For example, it may be set up such that names are appended to each of the patches and the patch names as well as the effect settings that have been set in the patches and each of the various parameters related to the waveform numbers are displayed.

In addition, in the processing of S87 and S88 of the wave information processing in the preferred embodiment described above (refer to FIG. 14), it has been configured such that in the switching of the screen display, a display switch to above the uppermost row or to below the lowest row cannot be executed. Instead of this, it may be configured such that by means of the operating direction of the page R button 27 or the page L button 26, a loop display is made from the uppermost row to the lowest row or from the lowest row to the uppermost row.

In addition, in the wave information processing in the preferred embodiment described above (refer to FIG. 14), it has been configured such that the waveform number retrieval is started by the operation of the instruction button 28, but it may also be set up such that the wave information processing is executed automatically in those cases where the waveform data are deleted, and in those cases where waveform data that are the object of the deletion are to be used somewhere else, those retrieval results are suggested to the operator.

In accordance with the embodiments of an electronic percussion instrument described herein, for the waveforms (the waveform data) that are sampled (input), the performance operators (for example, the pads) that should be affiliated with said waveforms are selected in advance, an unused identification number (for example, a waveform number) is searched for, assigned to the waveform that has been input and written to the storage medium (for example, the waveform memory or RAM). Together with this, the relevant identification number is also assigned to the performance operator. In other words, the waveform that has been input is assigned and written to the storage medium corresponding to the new identification number in the electronic percussion instrument and, together with this, is assigned in conformance with the performance operator by means of the relevant identification number. Therefore, not only is there no need to search for an unused number in advance but since, if the affiliation of the sampled waveform to the operator that is desired is selected in advance, the sampled waveform is automatically affiliated, it is possible to lighten the workload that was placed on the operator in the past. In addition, in those cases where the operator has affiliated the sampled waveform to an identification number that has been designated, if the identification number that has been designated is a number that is already being used, an identification number that has not yet been used in the relevant electronic percussion instrument is automatically searched for and assigned.

In addition, in accordance with the embodiments of an electronic percussion instrument described herein, at the time of sampling of the waveform data (the waveforms) the address that corresponds to a musically appropriate break (musical period) such as break for the beat or bar based on a specified musical timing (for example, the tempo of the beat count and the like) in which the musical period has been set in advance for the waveform data that have been sampled is set (marked) as the break point (the break address). Therefore, in those cases where the data that have been sampled are utilized as the raw material for a performance or a composition and the like, it is possible for the waveform data that have been sampled to be utilized without causing problems for the operator. In addition, since the break point is set in conformance with the recording stop instruction timing, for example, in those cases where the recording stop instruction timing is later than the intermediate point of the bar, if the break point is made such that it is the bar line of the end of the relevant bar, even if the operator has issued a recording stop instruction at a timing that is earlier than the relevant ending bar line, the break point will be set based on a musically appropriate period of a beat or bar unit. In addition, when the tempo value or the beat count is set for the waveform data that have already been sampled and recorded in the waveform storage means, the break point of the relevant waveform is set in accordance with a calculation based on the tempo value and beat count that have been set and the value that corresponds to the sampling period for the relevant waveform. Since for the break point that has been set in this manner, the break is satisfactory musically, the break is convenient for utilization of the data as the raw material for performance or composition.

Furthermore, in accordance with the embodiment of an electronic percussion instrument described herein, the specified waveform number or musical tone signal is retrieved, and a display that corresponds to the group that includes the musical tone signal that has been retrieved is displayed. Therefore, it is possible to easily retrieve any musical tone signal or waveform desired, and it is possible to easily ascertain the group that includes the musical tone signal or waveform that has been retrieved. In addition, since the display can also display a condition in which there has been an assignment to a plurality of pads, it is possible to ascertain the assignment status of the musical tone signals or waveforms to pad units.

Accordingly, in accordance with the embodiments of an electronic percussion instrument described herein and various alternative embodiments, there are the advantageous results that since an identification number and break point that are useful for the management and editing of the waveform data that have been input by the sampling are automatically assigned, the operator can manage the sampled waveform data with simple operations and, in addition, it is possible edit the sampled waveform data for use in performance or composition without performing complicated operations.

What is claimed is:

1. An electronic percussion instrument comprising:
a plurality of pads;
waveform input means with which the waveforms are input;
first storage means with which the waveforms that are input by the waveform input means are stored;

waveform assignment means with which the waveforms that are stored by the waveform storage means are respectively assigned to the plurality of pads;

musical tone generation means with which, when a pad to which a waveform has been assigned is struck, a musical tone is generated based on the waveform that has been assigned to the pad;

waveform identification code assignment means with which a waveform identification code is assigned to the waveform that is input by the waveform input means; and first retrieval means that retrieves unused waveform identification codes;

wherein the first storage means stores the waveform that is input in association with the waveform identification code that has been assigned to that waveform;

wherein the first storage means stores the waveform identification code in association with one of the plurality of pads to assign the waveform to a pad; and wherein the waveform identification code assignment means assigns an unused waveform identification code to the waveform that is input.

2. The electronic percussion instrument cited in claim 1, further comprising:

waveform identification code designation means with which a user specifies a waveform identification code for the waveform that is input; and determination means with which it is determined whether the specified waveform identification code already exists as a waveform identification code that is stored by the first storage means, wherein, in those cases where the waveform identification code that has been designated by the waveform identification code designation means already exists, an unused waveform identification code is retrieved by the first retrieval means, and the waveform identification code assignment means gives precedence to the unused waveform identification code and assigns the unused waveform identification code to the waveform that is input.

3. An electronic percussion instrument comprising:

a plurality of pads;

waveform input means with which the waveforms are input;

first storage means with which the waveforms that are input by the waveform input means are stored;

waveform assignment means with which the waveforms that are stored by the waveform storage means are respectively assigned to the plurality of pads;

musical tone generation means with which, when a pad to which a waveform has been assigned is struck, a musical tone is generated based on the waveform that has been assigned to the pad;

second storage means with which a plurality of groups are stored, where the waveforms that have been respectively assigned to the plurality of pads by the waveform assignment means comprise one group;

waveform designation means with which a waveform that has been stored in the first storage means is designated;

second retrieval means with which groups that include the waveform that has been designated by the waveform designation means are retrieved from the second storage means; and display means with which a display is made that corresponds to a group that includes the waveform that has been retrieved by the second retrieval means.

4. The electronic percussion instrument cited in claim 3, wherein the display means produces a display that displays the state of the assignments of the waveforms in that group to the plurality of pads.

5. An electronic percussion instrument comprising:

a plurality of pads;

waveform input means with which the waveforms are input;

first storage means with which the waveforms that are input by the waveform input means are stored;

waveform assignment means with which the waveforms that are stored by the waveform storage means are respectively assigned to the plurality of pads;

musical tone generation means with which, when a pad to which a waveform has been assigned is struck, a musical tone is generated based on the waveform that has been assigned to the pad;

waveform identification code assignment means with which a waveform identification code is assigned to the waveform that is input by the waveform input means;

second storage means in which respective group identification codes that identify groups are stored, wherein the waveform identification codes that have been respectively assigned to the plurality of pads by the waveform identification code assignment means comprise a group;

waveform identification code designation means with which a waveform identification code is designated;

second retrieval means with which group identification codes that are stored in the second storage means are retrieved in response to a waveform identification code that has been designated by the waveform identification code designation means; and display means with which a display is made that corresponds to a group that include the designated waveform identification code, wherein the first storage means stores the waveform that is input in association with the waveform identification code that has been assigned to that waveform;

wherein the first storage means stores the waveform identification code in association with one of the plurality of pads to assign the waveform to a pad; and wherein, upon selection of one of the group identification codes, the waveform assignment means assigns the waveform identification codes associated with the selected group identification code to respective ones of the plurality of pads.

6. The electronic percussion instrument cited in claim 5, wherein the display means produces a display that corresponds to the selected group identification code and displays the assignment state of the waveform identification codes in that group to the plurality of pads.

7. An electronic percussion instrument comprising:

a plurality of pads;

waveform input means with which the waveforms are input;

first storage means with which the waveforms that are input by the waveform input means are stored;

waveform assignment means with which the waveforms that are stored by the waveform storage means are respectively assigned to the plurality of pads;

musical tone generation means with which, when a pad to which a waveform has been assigned is struck, a musical tone is generated based on the waveform that has been assigned to the pad;

music timing setting means with which a musical timing that specifies a musical period is set;

recording start instruction means with which the start of recording is instructed;

first storage means with which, when the start of the recording has been instructed by the recording start instruction means, the amplitude values of the specified waveforms that are input in the sampling period are stored with the storage positions designated in the input order;

recording stop means with which the recording is stopped; and break point setting means which sets the break point for the storage position of the waveform in the first storage means when the stopping of the recording has been instructed by the recording stop means based on the recording stop timing and the musical timing that has been set by the musical timing setting.

8. The electronic percussion instrument cited in claim 7, wherein the music timing setting means includes at least tempo setting means with which the tempo value is set.

9. The electronic percussion instrument cited in claim 7, wherein, when the stopping of the recording has been instructed by the recording stop instruction means:

the break point setting means sets the musical period that has most recently been reached prior to the recording stop timing as the break point if the time difference between the recording stop timing and the musical period that has most recently been reached prior to the recording stop timing is within a specified time; and the break point setting means sets the musical period that is initially reached after the recording stop timing as the break point if the time difference exceeds a specified time.

10. The electronic percussion instrument cited in claim 7, further comprising:

music timing means with which the tempo value and the beat count are set;

first storage means with which the amplitude values of the specified waveforms that have been sampled during the sampling period are stored sequentially; and break point setting means with which the break point of the waveform is set based on the tempo value and the beat count that have been set by the recording timing setting means and the value that corresponds to the sampling period.

11. A programmable electronic percussion instrument, the instrument including a plurality of pads, and further including a computer readable medium storing programming code for controlling the instrument to perform processing comprising:

sampling an input waveform;
storing the sampled input waveform;
assigning the sampled waveform to one of said pads;
generating a tone using the sampled waveform in response to a strike of the pad to which the sampled waveform is assigned;
automatically assigning an identifier to the sampled waveform; and
associating the identifier of the sampled waveform with said one of said pads;
wherein automatically assigning an identifier to the sampled waveform comprises finding one or more unused waveform numbers and assigning one of the unused waveform numbers to the sampled waveform.

12. A programmable electronic percussion instrument, the instrument including a plurality of pads, and further including a computer readable medium storing programming code for controlling the instrument to perform processing comprising:

sampling an input waveform;
storing the sampled input waveform;
assigning the sampled waveform to one of said pads;
generating a tone using the sampled waveform in response to a strike of the pad to which the sampled waveform is assigned;
receiving user input specifying a waveform number for the sampled waveform;
determining whether the specified waveform number is already in use as an identifier of another waveform;
if the specified waveform number is not already in use as an identifier of another waveform, assigning the specified waveform number to the sampled waveform as an identifier; and
if the specified waveform number is already in use as an identifier of another waveform, finding one or more unused waveform numbers and assigning one of the unused waveform numbers to the sampled waveform as an identifier.

13. A programmable electronic percussion instrument, the instrument including a plurality of pads, and further including a computer readable medium storing programming code for controlling the instrument to perform processing comprising:

sampling an input waveform;
storing the sampled input waveform;
assigning the sampled waveform to one of said pads;
generating a tone using the sampled waveform in response to a strike of the pad to which; the sampled waveform is assigned; and
assigning the sampled waveform to a group of waveforms, wherein each waveform of the group is assigned to a respective one of said pads.

14. The percussion instrument claimed in claim 13, wherein said processing further comprises:

receiving user input specifying a waveform;
determining each of groups of waveforms in which said specified waveform is assigned to one or more of said pads; and
providing a display showing respective identifiers of groups in which said specified waveform is assigned to one or more of said pads.

15. The percussion instrument claimed in claim 14, wherein said display further shows pads to which waveforms are assigned for each of said groups.

16. The percussion instrument claimed in claim 14, wherein said processing further comprises:

generating a tone using the specified waveform having in response to a strike of any of the pads.

17. The percussion instrument claimed in claim 13, wherein said processing further comprises:

receiving user input specifying a group identifier; and
providing a display showing pads to which waveforms are assigned for a group having the specified identifier.

18. The percussion instrument claimed in claim 13, wherein said processing further comprises:

receiving user input specifying a group identifier; and
assigning waveforms to respective ones of said pads in accordance with assignments of said waveforms to said pads in the group having the specified group identifier.

19. A process of controlling a programmable electronic percussion instrument comprising:

receiving user input specifying musical time parameters of an input waveform;

sampling the input waveform;

receiving a user instruction to stop sampling of the waveform; and setting an endpoint for the sampled waveform in response to the instruction to stop sampling, wherein the endpoint is set such that the sampled waveform has a length that is a whole number of musical time units of the input waveform based on the specified musical time parameters.

20. The process claimed in claim 19, wherein said user input specifying musical time parameters of an input waveform specifies a tempo of said input waveform, and wherein the endpoint is set to provide a whole number of musical time units based on said tempo.

21. The process claimed in claim 20, wherein said musical time units are beats of said input waveform.

22. The process claimed in claim 20, wherein said user input specifying musical time parameters of the input waveform further specifies a beat count of a bar of said input waveform, and wherein said musical time units are bars of said input waveform.

23. The process claimed in claim 20, wherein, if the instruction to stop sampling is received prior to a mid-point of a musical time unit of the sampled waveform, the endpoint of the sampled waveform is set at the beginning of the musical time unit during which the instruction is received.

24. The process claimed in claim 20, wherein, if the instruction to stop sampling is received after a mid-point of a musical time unit of the sampled waveform, the endpoint of the sampled waveform is set at the end of the musical time unit during which the instruction is received.

25. The process claimed in claim 20, wherein, if the instruction to stop sampling is received at a mid-point of a musical time unit of the sampled waveform, the endpoint of the sampled waveform is set at the end of the musical time unit during which the instruction is received.

26. The process claimed in claim 19, wherein said processing further comprises:

storing said endpoint and said musical time parameters in association with the sampled waveform.

27. The process claimed in claim 19, wherein said processing further comprises:

receiving a user command to move a start point of the sampled waveform by a specified amount;

moving the start point of the sampled waveform by the specified amount; and moving the endpoint of the sampled waveform by the specified amount to preserve the length of the sampled waveform in musical time units.

28. The process claimed in claim 19, wherein said musical time parameters of the sampled waveform include a tempo of the sampled waveform, and wherein said processing further comprises:

receiving user input specifying a new tempo of the sampled waveform; and setting a new endpoint using said new tempo to maintain the whole number of musical time units of the sampled waveform at the new tempo.

29. The process claimed in claim 19, wherein said musical time parameters of the sampled waveform include a tempo of the sampled waveform, and wherein said processing further comprises:

receiving user input specifying a new length of the sampled waveform in musical time units; and setting a new endpoint for the sampled waveform using the tempo of the sampled waveform and the specified number of musical time units.

* * * * *